United States Patent
Noda et al.

(10) Patent No.: US 8,619,830 B2
(45) Date of Patent: Dec. 31, 2013

(54) PHOTONIC CRYSTAL SURFACE EMISSION LASER

(75) Inventors: Susumu Noda, Kyoto (JP); Seita Iwahashi, Kyoto (JP); Toshiyuki Nobuoka, Fukuyama (JP); Takui Sakaguchi, Kyoto (JP); Eiji Miyai, Kyoto (JP); Wataru Kunishi, Kyoto (JP); Dai Ohnishi, Otsu (JP); Kazuya Nagase, Kawanishi (JP); Yoshikatsu Miura, Kyoto (JP)

(73) Assignees: Kyoto University, Kyoto-shi (JP); Rohm Co., Ltd., Kyoto-shi (JP)

( * ) Notice: Subject to any disclaimer, the term of this patent is extended or adjusted under 35 U.S.C. 154(b) by 0 days.

(21) Appl. No.: 13/571,985

(22) Filed: Aug. 10, 2012

(65) Prior Publication Data
US 2013/0039375 A1 Feb. 14, 2013

(30) Foreign Application Priority Data
Aug. 12, 2011 (JP) ................. 2011-177292

(51) Int. Cl.
*H01S 5/183* (2006.01)
(52) U.S. Cl.
USPC ............... 372/50.124; 372/44.01; 372/92
(58) Field of Classification Search
USPC .................................. 372/50.124
See application file for complete search history.

(56) References Cited

U.S. PATENT DOCUMENTS

2004/0213316 A1* 10/2004 Lipson ..................... 372/99
2009/0074024 A1* 3/2009 Noda et al. ............... 372/50.12
2009/0135869 A1* 5/2009 Noda et al. ............... 372/41

FOREIGN PATENT DOCUMENTS

JP  A-2009-76900  4/2009

* cited by examiner

Primary Examiner — Xinning Niu
(74) Attorney, Agent, or Firm — Oliff & Berridge, PLC

(57) ABSTRACT

A photonic crystal surface emission laser includes an active layer, and a photonic crystal layer made of a plate-shaped slab provided with modified refractive index area having a refractive index different from that of the slab, the modified refractive index areas being arranged on each of the lattice points of a first rhombic-like lattice and a second rhombic-like lattice in which both diagonals are mutually parallel and only one diagonal is of a different length, wherein $a_{x1}$, $a_{x2}$, $a_y$, and n satisfy the following inequality:

$$\frac{\left|\frac{1}{a_{x1}} - \frac{1}{a_{x2}}\right|}{\sqrt{\left(\frac{1}{a_{x1}} + \frac{1}{a_{x2}}\right)^2 + \left(\frac{2}{a_y}\right)^2}} \leq \frac{1}{n}.$$

16 Claims, 14 Drawing Sheets

FIRST RHOMBIC LATTICE +
SECOND RHOMBIC LATTICE

FIRST RHOMBIC LATTICE

SECOND RHOMBIC LATTICE

FIRST RHOMBIC LATTICE + SECOND RHOMBIC LATTICE

SQUARE LATTICE + PRIMITIVE RECTANGULAR LATTICE
($a_y = a_{x1} \neq a_{x2}$)

PRIMITIVE RECTANGULAR LATTICE +
PRIMITIVE RECTANGULAR LATTICE ($a_y \neq a_{x1} \neq a_{x2}$)

Fig. 4A
FIRST RHOMBIC LATTICE + SECOND RHOMBIC LATTICE
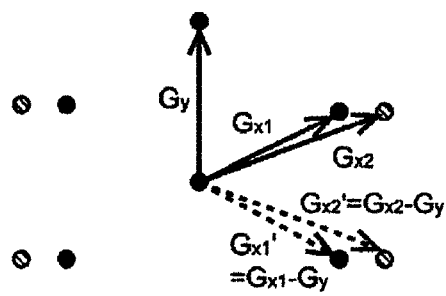
Fig. 4B
PRIMITIVE RECTANGULAR (SQUARE) LATTICE + PRIMITIVE RECTANGULAR LATTICE
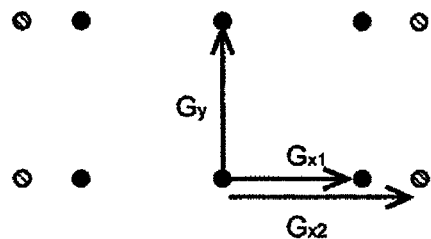
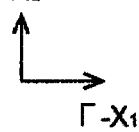
→ RECIPROCAL LATTICE VECTOR
Fig. 5A
FIRST RHOMBIC LATTICE + SECOND RHOMBIC LATTICE
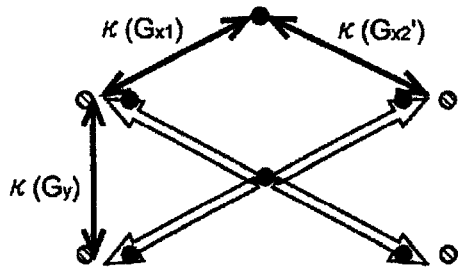
Fig. 5B
PRIMITIVE RECTANGULAR (SQUARE) LATTICE + PRIMITIVE RECTANGULAR LATTICE
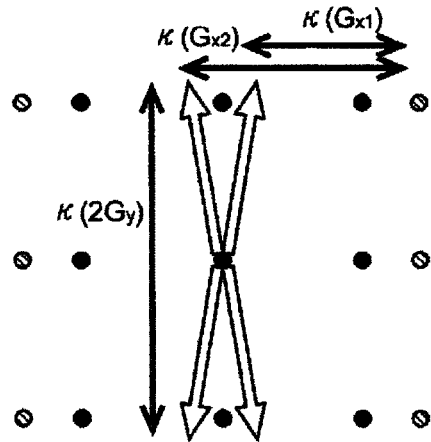
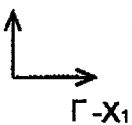
⇒ FUNDAMENTAL WAVE VECTOR

PRESENT EMBODIMENT

COMPARATIVE EXAMPLE

PRESENT EMBODIMENT

COMPARATIVE EXAMPLE

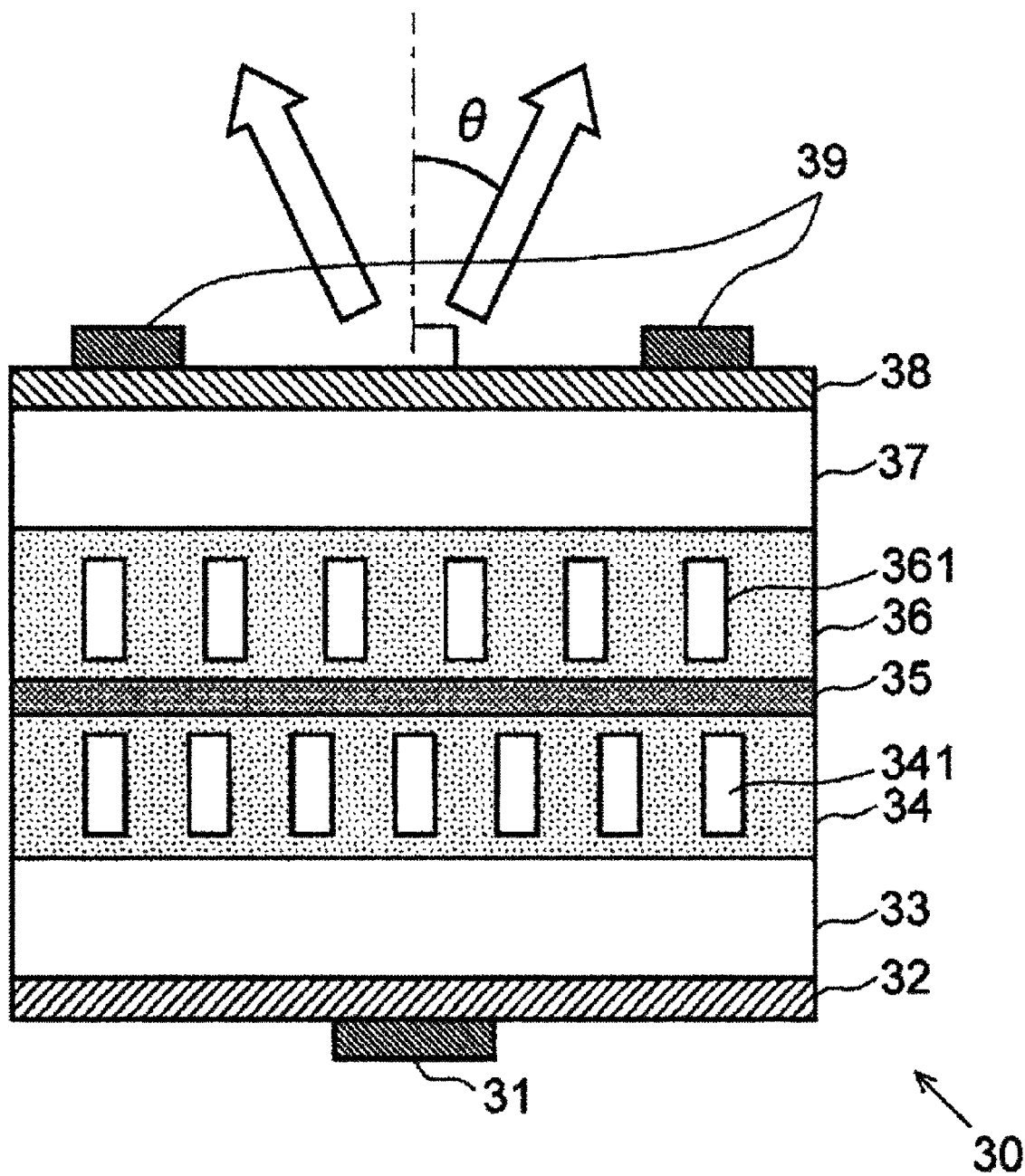

Fig. 13
FIRST RHOMBIC LATTICE
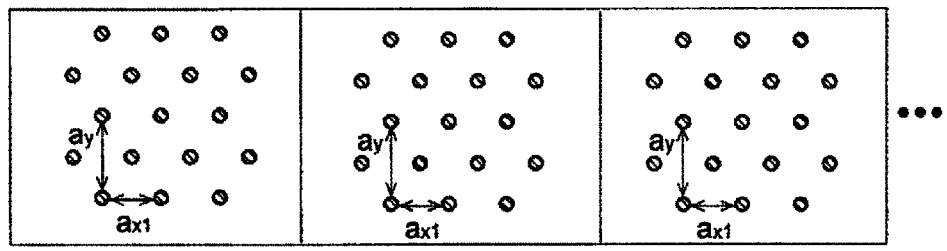
SECOND RHOMBIC LATTICE
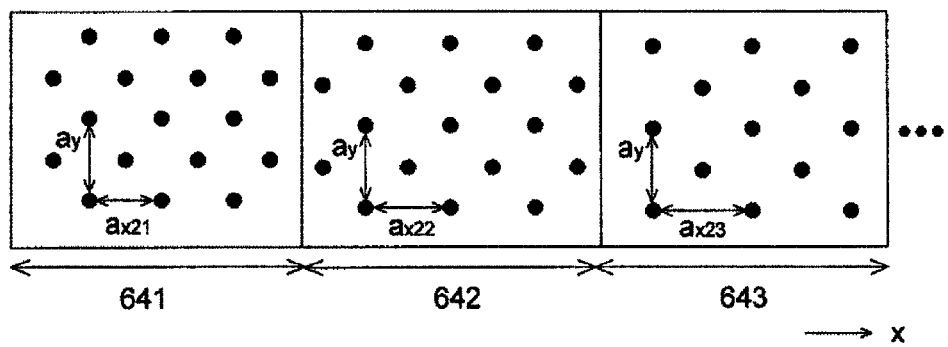
Fig. 14
FIRST RHOMBIC LATTICE
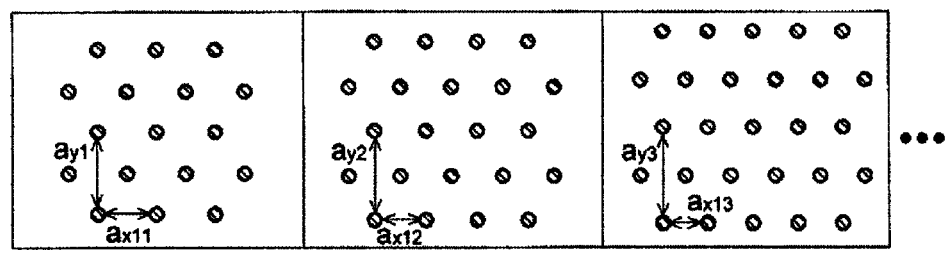
SECOND RHOMBIC LATTICE
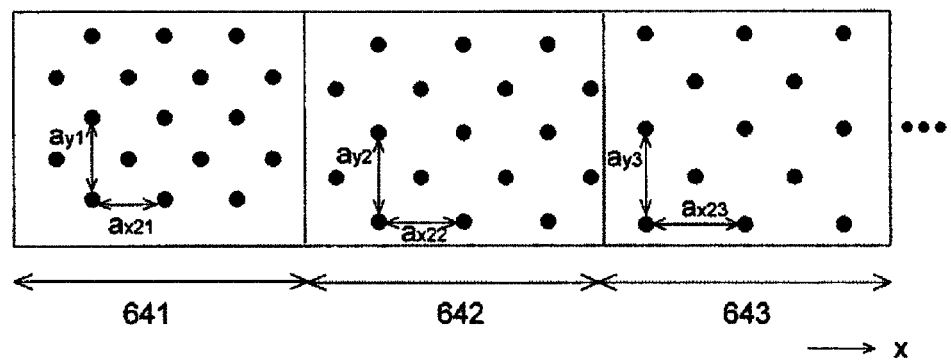

FIRST RHOMBIC-LIKE LATTICE 741A

SECOND RHOMBIC-LIKE LATTICE 741B

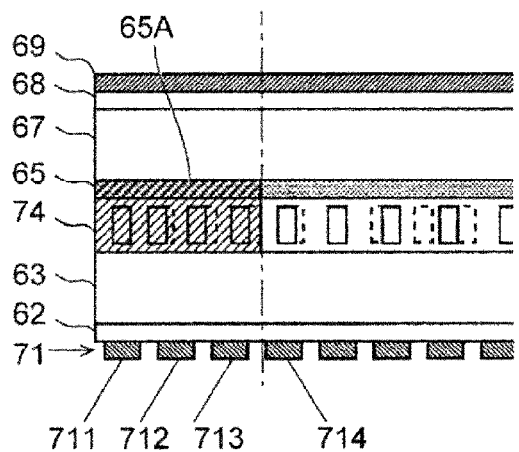
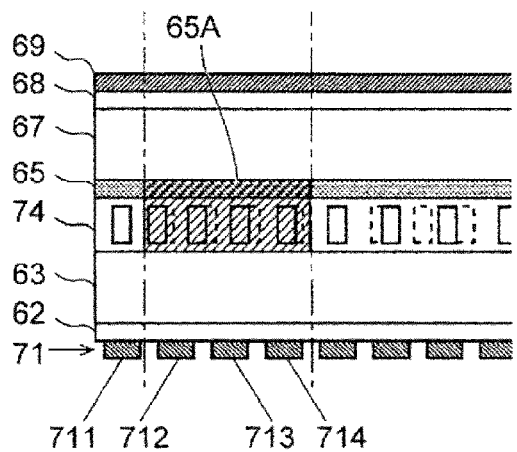
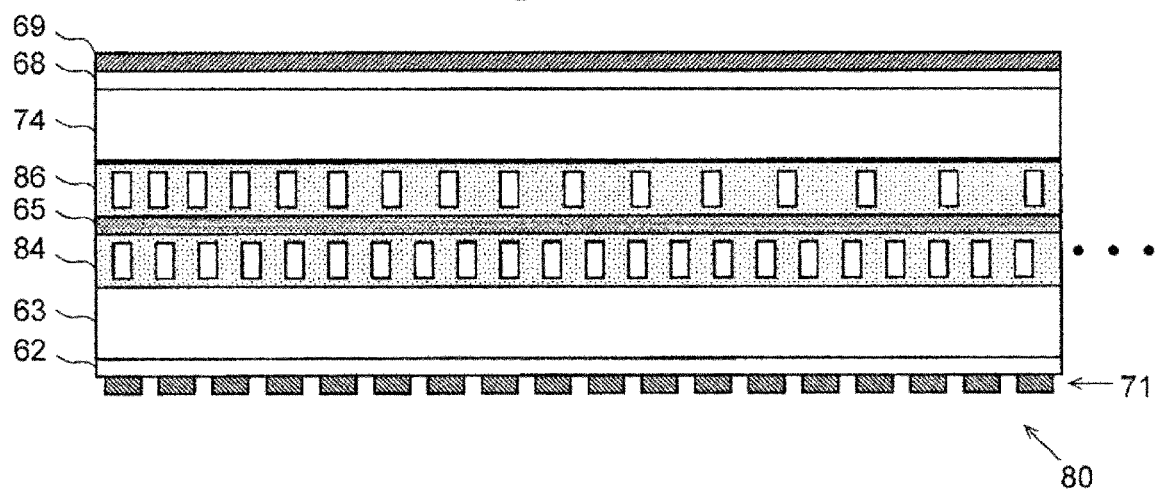

PHOTONIC CRYSTAL SURFACE EMISSION LASER

TECHNICAL FIELD

The present invention relates to a photonic crystal surface emission laser. More specifically, it relates to a photonic crystal surface emission laser for obliquely emitting a laser beam from the direction perpendicular to the emission plane.

BACKGROUND ART

Semiconductor lasers have many advantages, such as being small and inexpensive as well as having low power consumption and a long operating life, and have been used in many applications, such as a light source for optical recording, a light source for communication, a laser display, a laser printer, and a laser pointer. Laser displays and laser printers generally use a scanning method. In a currently used semiconductor laser scanning method, the orientation of a laser beam of a semiconductor laser is controlled by using an external and additional element such as a polygon mirror, a MEMS (micro-electro mechanical system) micro mirror, or a unit using an acousto-optical element. However, adding such a scanning mechanism to a semiconductor laser makes it difficult to reduce the size and improve working speed and durability.

Given this factor, the inventors of the present invention have been providing a photonic crystal surface emission laser capable of changing the emission direction. The photonic crystal surface emission laser used in Patent Document 1 is a combination of two photonic crystal layers with different periods. This photonic crystal surface emission laser emits a laser beam in the oblique direction with respect to the emission plane (which will be hereinafter referred to as an "oblique beam") based on the principle that a spatial beat is generated due to the frequency difference of the standing waves of light formed in the two photonic crystal layers. Increasing the frequency difference increases the emission angle (inclination angle) of the emitted laser beam.

The emitting direction controllable photonic crystal surface emission laser of Patent Document 1 uses the change in the output angle caused by the frequency difference. In the emitting direction controllable photonic crystal surface emission laser, the period of the modified refractive index area of one photonic crystal layer is fixed, whereas that of the other photonic crystal layer changes according to the position within the same layer. This structure enables an emission of an oblique beam at a different emission angle according to the position of the laser oscillation.

Adding an emission direction control function to the semiconductor laser itself can achieve a reduction in size and increase the working speed and durability. This should create new application fields such as a portable device with a built-in laser display and an optical interconnection between electronic chips.

BACKGROUND ART DOCUMENT

Patent Document

[Patent Document 1] JP-A 2009-076900

DISCLOSURE OF THE INVENTION

Problem to be Solved by the Invention

Patent Document 1 describes that a square lattice and a rectangular lattice, or two different rectangular lattices having different periods, are used as the lattice arrangement of two photonic crystals. However, subsequent research revealed that, if designed for an emission angle of 30° or more, the photonic crystal surface emission laser with a combination of the aforementioned lattice arrangements causes an emission of a light in an unintended mode. Even if the photonic crystal surface emission laser is designed for an emission angle of 30° or less, the threshold of a laser oscillation is high, which requires an application of a high voltage.

The problem to be solved by the present invention is to provide a photonic crystal surface emission laser capable of inclining the emission direction as designed even if the emission angle of the oblique beam is designed to be 30° or more, and capable of generating a stable laser oscillation with a low threshold of laser oscillation.

Means for Solving the Problem

To solve the aforementioned problem, the first aspect of the present invention provides a photonic crystal surface emission laser, including:

an active layer; and a photonic crystal layer made of a plate-shaped slab provided with modified refractive index areas having a refractive index different from that of the slab, the modified refractive index areas being arranged on each of the lattice points of a first rhombic-like lattice and a second rhombic-like lattice in which the two diagonals are respectively parallel and only one of the two diagonals has different lengths, wherein:

$a_{x1}$, $a_{x2}$, $a_y$, and n satisfy the following inequality:

$$\frac{\left|\frac{1}{a_{x1}} - \frac{1}{a_{x2}}\right|}{\sqrt{\left(\frac{1}{a_{x1}} + \frac{1}{a_{x2}}\right)^2 + \left(\frac{2}{a_y}\right)^2}} \leq \frac{1}{n},$$

where $a_{x1}$ and $a_y$ respectively represent the length of aforementioned one of the two diagonals having different lengths and that of the other one of the two diagonals of the first rhombic-like lattice, $a_{x2}$ ($a_{x2} \neq a_{x1}$) and $a_y$ respectively represent the length of aforementioned one of the two diagonals having different lengths and that of the other one of the two diagonals of the second rhombic-like lattice, and n represents an equivalent refractive index of the photonic crystal layer in the direction perpendicular to the photonic crystal layer.

To solve the aforementioned problem, the second aspect of the present invention provides a photonic crystal surface emission laser, including:

an active layer;

a first photonic crystal layer made of a plate-shaped slab provided with modified refractive index areas having a refractive index different from that of the slab, the modified refractive index areas being arranged on the lattice points of a first rhombic-like lattice; and a second photonic crystal layer made of a plate-shaped slab provided with modified refractive index areas arranged on a second rhombic-like lattice in which two diagonals are parallel to those of the first rhombic-like lattice and the length of only one of the two diagonals is different from that of the first rhombic-like lattice, wherein:

$a_{X1}$, $a_{X2}$, $a_y$, and n satisfy the following inequality:

$$\frac{\left|\frac{1}{a_{x1}} - \frac{1}{a_{x2}}\right|}{\sqrt{\left(\frac{1}{a_{x1}} + \frac{1}{a_{x2}}\right)^2 + \left(\frac{2}{a_y}\right)^2}} \leq \frac{1}{n},$$

where $a_{x1}$ and $a_y$ respectively represent the length of aforementioned one of the two diagonals having a different length and that of the other one of the two diagonals of the first rhombic-like lattice, $a_{x2}$ ($a_{x2} \neq a_{x1}$) and $a_y$ respectively represent the length of aforementioned one of the two diagonals having a different length and that of the other one of the two diagonals of the second rhombic-like lattice, and n represents an equivalent refractive index of the first photonic crystal layer and the second photonic crystal layer in the direction perpendicular to the first photonic crystal layer and the second photonic crystal layer.

The rhombic-like lattice here means an extended concept of a normal rhombic lattice. A normal rhombic lattice will be described first. A rhombic lattice is characterized in that it has a rhombic unit lattice, two primitive translation vectors that have the same length, and the angle ψ formed by the two primitive translation vectors is within the range of 0°<ψ<180°. The two diagonals in a rhombic lattice are mutually orthogonal, and their lengths are the same in every unit lattice.

The rhombic-like lattice in the present invention includes lattices in which the length of either one of two diagonals in a unit lattice differs according to the position in the direction in which that diagonal extends, in addition to the normal rhombic lattice as previously described. Aside from those of rhombic lattices, unit lattices in a rhombic-like lattice have a distorted rhombic shape and their shape differs according to their position. Hence, they are not crystallographically a "unit lattice" to be exact, but they are called a "unit lattice" for convenience in the present application.

A triangular lattice (or a hexagonal lattice) and a square lattice are special cases of rhombic (rhombic-like) lattices. That is, if the angle ψ formed by two primitive translation vectors of a rhombic lattice is 60° or 120°, it is a triangular lattice, and if the angle ψ is 90°, it is a square lattice. Rectangular lattices are not classified as rhombic-like lattices. Therefore, the structure of the photonic crystal surface emission laser according to the present invention is different from that of the photonic crystal surface emission laser in which a square lattice and a rectangular lattice are combined or two rectangular lattices are combined, as described in Patent Document 1. Patent Document 1 also describes the use of two triangular lattices, but does not specifically state how two periods are changed in the triangular lattices. By definition, the triangle of a triangular lattice is an equilateral triangle. Hence, in the present invention, even if the lattice arrangement of one lattice is triangular, that of the other lattice is not triangular. Therefore, the structure of the photonic crystal surface emission laser according to the present invention is different from that of the photonic crystal surface emission laser in which two triangular lattices are used, as described in Patent Document 1.

The inventors of the present invention have studied the photonic crystal surface emission laser described in Patent Document 1 and revealed that this photonic crystal surface emission laser causes an oscillation of laser light with a second-order coupling strength (feedback strength) κ. Generally speaking, increasing the order decreases the coupling strength, thus the threshold of the laser oscillation is increased and a light in an unintended mode is generated. In view of this fact, lattice arrangement combinations for a greater coupling strength have been studied and the inventors of the present invention have discovered that the photonic crystal surface emission laser according to the present invention causes an oscillation of laser light with a first-order coupling strength. The photonic crystal surface emission laser according to the present invention was actually manufactured, and the tests showed that with this structure the emission direction can be inclined up to 45° as designed. Additionally, the tests also showed that it causes an oscillation with a lower threshold than that of the photonic crystal surface emission laser of Patent Document 1 and is capable of preventing an emission of a laser in an unintended mode.

The photonic crystal surface emission laser according to the present invention may be characterized in that the length of the diagonals of a different length in the first rhombic-like lattice and/or the second rhombic-like lattice differs according to the position in the direction in which the diagonals of a different length extend, and include:

an electric current injection unit capable of injecting an electric current into only one part of the active layer and changing the injection position of the electric current in the direction of the diagonals.

This configuration allows an injection of an electric current into only one part of the active layer, causing a laser oscillation in a part of the photonic crystal layer that faces that part of the active layer. An oblique beam is emitted at an emission angle corresponding to the length of the diagonals of the first and second rhombic-like lattices in the part where the laser oscillation is caused. Therefore, with this photonic crystal surface emission laser, an oblique beam is emitted at a different emission angle according to the position where an electric current is injected. Hereinafter, such a photonic crystal surface emission laser will be referred to as an "emitting direction variable photonic crystal surface emission laser."

Effects of the Invention

The photonic crystal surface emission laser according to the present invention produces a laser oscillation with a first-order coupling strength. Therefore, the laser threshold is low compared to the photonic crystal surface emission laser of Patent Document 1, which has a second-order coupling strength. Therefore, a laser beam (inclined beam) can be stably emitted at an emission angle of up to 45°.

BRIEF DESCRIPTION OF THE DRAWINGS

FIG. 4A shows the reciprocal space and the reciprocal lattice vector for the two-dimensional lattice arrangement of the photonic crystal surface emission laser of the first embodiment, and FIG. 4B shows the reciprocal space and the reciprocal lattice vector for the two-dimensional lattice arrangement of the photonic crystal surface emission laser of Patent Document 1.

FIG. 5A is a model showing a coupled state of the photonic crystal surface emission laser of the first embodiment, and FIG. 5B is a model showing a coupled state of the photonic crystal surface emission laser of Patent Document 1.

FIG. 9 is a vertical sectional view showing the second embodiment of the photonic crystal surface emission laser according to the present invention.

FIG. 13 is of two top views showing examples of the first rhombic lattice and the second rhombic lattice, which can be used in the third embodiment.

FIG. 14 is a top view showing another example of the first rhombic lattice and the second rhombic lattice, which can be used in the third embodiment.

FIGS. 17A and 17B are a vertical sectional view for explaining the operation of the emitting direction variable photonic crystal surface emission laser of the fifth embodiment.

FIG. 18 is a vertical sectional view of an emitting direction variable photonic crystal surface emission laser, which is the sixth embodiment of the photonic crystal surface emission laser according to the present invention.

BEST MODES FOR CARRYING OUT THE INVENTION

Hereinafter, embodiments of the photonic crystal surface emission laser according to the present invention will be described. It should be noted that the present invention is not limited to the embodiments described below, but can be changed within the scope of the present invention.

First Embodiment

Figure 1:
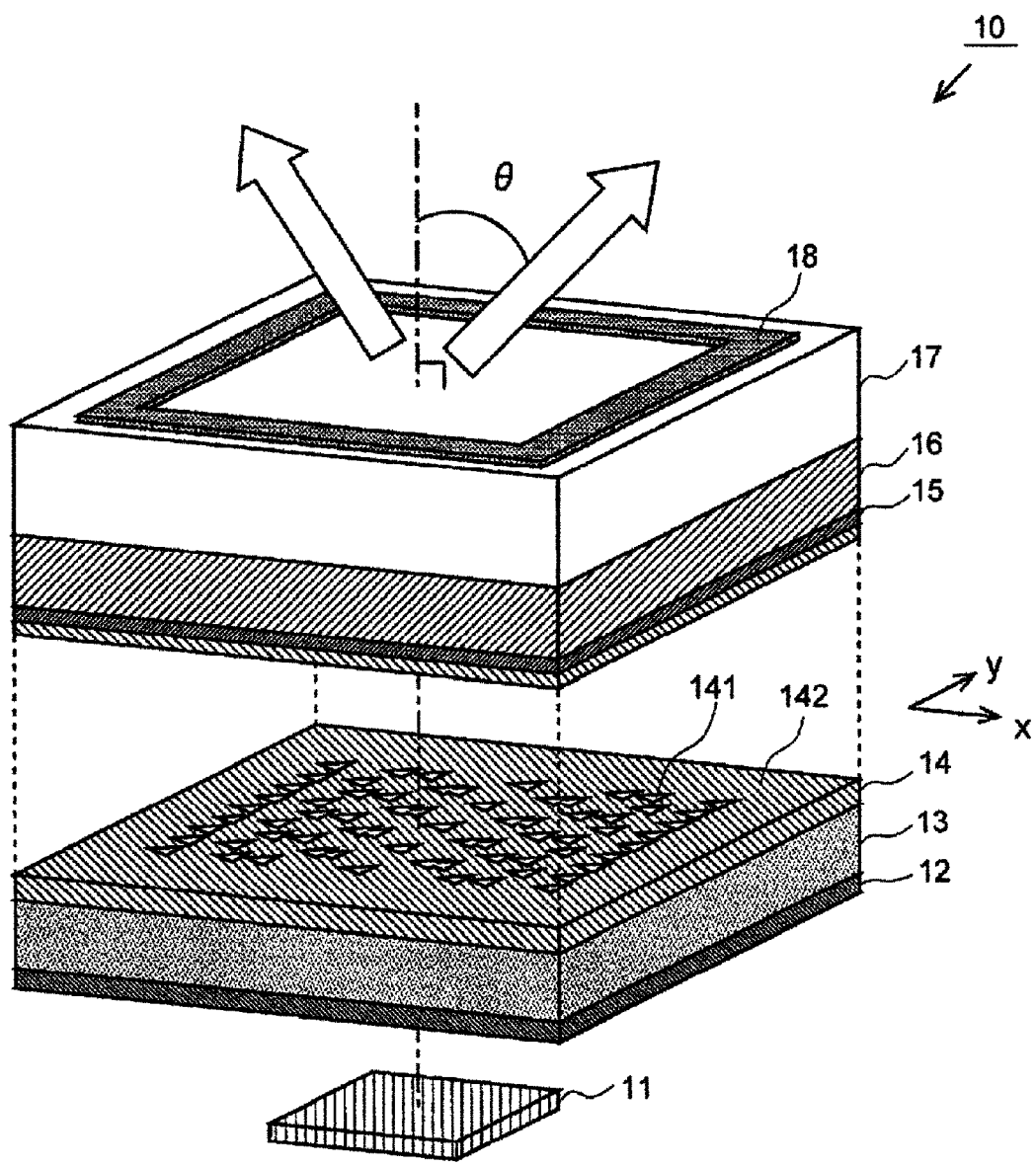
FIG. 1 is a perspective view showing the first embodiment of the photonic crystal surface emission laser according to the present invention.

The first embodiment of the photonic crystal surface emission laser according to the present invention will be described with reference to FIGS. 1 through 6. FIG. 1 is a perspective view of the photonic crystal surface emission laser of the present embodiment. This photonic crystal surface emission laser 10 is manufactured by layering, in this order, a back electrode 11, a lower substrate 12, a first cladding layer 13, a photonic crystal layer 14, an active layer 15, a second cladding layer 16, an upper substrate 17, and a window-like electrode 18. The photonic crystal surface emission laser 10 of the present embodiment emits a laser beam in the inclined direction at an emission angle of θ from the normal to the surface of the upper substrate 17 on the side of the window-like electrode 18 through an opening (window) 181 provided in the center of the window-like electrode 18.

In the present embodiment, a p-type semiconductor of gallium arsenide (GaAs) is used for the lower substrate 12, a p-type semiconductor of aluminum gallium arsenide (AlGaAs) for the first cladding layer 13, n-AlGaAs for the second cladding layer 16, and n-GaAs for the upper substrate 17. The active layer 15 has multiple quantum wells (MQW) made of indium gallium arsenide (InGaAs)/gallium arsenide (GaAs). The back electrode 11 and the window-like electrode 18 are made of gold. The materials of these layers are not limited to the aforementioned, and those used in each layer in a conventional photonic crystal surface emitting laser can be used without modification. Other layers, such as a spacer layer, may be inserted among the aforementioned layers.

In the photonic crystal layer 14, holes (i.e. modified refractive index areas) 141 are cyclically arranged at lattice points (which will be described later) in a plate-shaped slab 142. In the present embodiment, p-GaAs is used for the slab 142. The shape of the holes 141 is an equilateral triangle. However, some other form, such as a circle, may also be taken. The material of the slab 142 is not limited to the aforementioned, and any kind of material used in conventional photonic crystal surface emission lasers can be used. The modified refractive index area may be, in place of the hole 141, a member (modified refractive index member) whose refractive index is different from that of the slab 142. A hole is advantageous in its ease of processing, whereas a modified refractive index member is useful in the possible case of deformation of a matrix body layer due to heating during material processing.

Figure 2A:
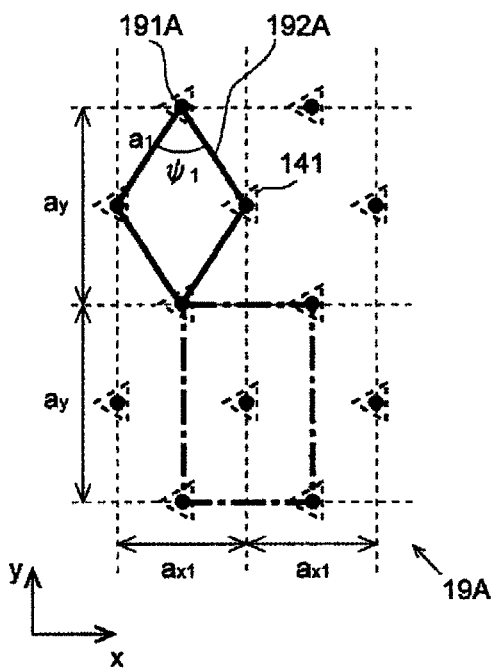
FIGS. 2A through 2C are a schematic diagram showing the two-dimensional lattice arrangement of the photonic crystal layer in the photonic crystal surface emission laser of the first embodiment.
Figure 2B:
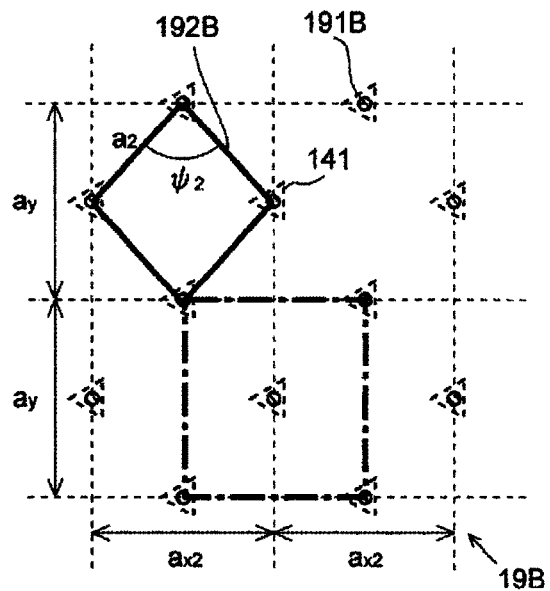
Figure 2C:
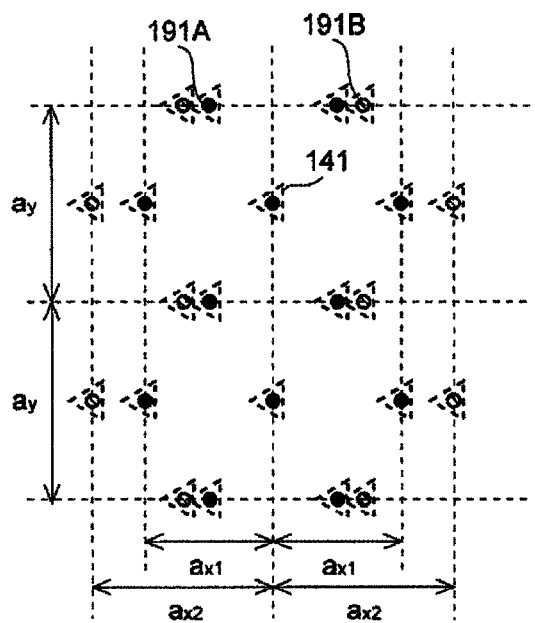

The lattice points at which the holes 141 are arranged in the photonic crystal layer 14 will now be described with reference to FIG. 2. In the present embodiment, a lattice (FIG. 2C) is used in which the first rhombic lattice 19A (FIG. 2A) and the second rhombic lattice 19B (FIG. 2C) overlap each other. The first rhombic lattice 19a and the second rhombic lattice 19B correspond to the normal rhombic lattice among the previously described rhombic-like lattices. (Rhombic-like lattices other than the rhombic lattice will be described in the fifth and sixth embodiments.) The first rhombic lattice 19A is composed of lattice points 191A, and has a rhombic-shape first unit lattice 192A. Hereinafter, diagonals of a unit lattice in a rhombic lattice will be simply referred to as "diagonals." The direction in which one diagonal extends will be referred to as the x-direction and that in which the other diagonal extends as the y-direction. Since the first unit lattice 192A is rhombic, it is obvious that these diagonals are mutually orthogonal. The length of these diagonals is $a_{x1}$ in the x-direction and $a_y$ in the y-direction. The second rhombic lattice 19B is composed of lattice points 191B, and has a second unit lattice 192B, which is a rhombus in which the directions of the diagonals are the same as those of the first rhombic lattice 19A. The length of the diagonal of the second rhombic lattice 19B is $a_{x2}$ in the x-direction, which is longer than that of the first rhombic lattice 19A, and $a_y$ in the y-direction, which is the same as that of the first rhombic lattice 19A. The values of $a_{x1}$, $a_{x2}$, and $a_y$ satisfy formula (1), which will be described later.

In the present application, the shape of a rhombic lattice is defined by means of the lengths of the diagonals as previously described for convenience of explanation. However, it is generally defined by using the length a of one side and the angle ψ formed by two adjacent sides of the rhombus in a unit lattice. In such a general definition, the length $a_1=(½)\times(a_{x1}^2+a_y^2)^{0.5}$ and the angle $\psi_1=2\arctan(a_{x1}/a_y)$ for the first rhombic lattice 19A and the length $a_2=(½)\times(a_{x2}^2+a_y^2)^{0.5}$ and the angle $\psi_2=2\arctan(a_{x2}/a_y)$ for the second rhombic lattice 19B. In a rhombic lattice, the smallest rectangle surrounded by the diagonals of a unit lattice may be defined as a unit lattice that is different from a rhombic unit lattice (as in the rectangles shown with alternate long and short dash lines in FIGS. 2A and 2B). Such a rectangular unit lattice has four angles and a lattice point in the center thereof. A lattice having such a unit lattice is called a centered rectangular lattice. It should be noted that the rhombic lattice and the rectangular lattice are the same thing, differing only in how the unit lattice is determined. The "rectangular lattice" described in Patent Document 1 is not a "centered rectangular lattice" because it does not have a lattice point in the center thereof. Hereinafter, the rectangular lattice that is not a "centered rectangular lattice" will be referred to as a "primitive rectangular lattice."

Figure 3A:
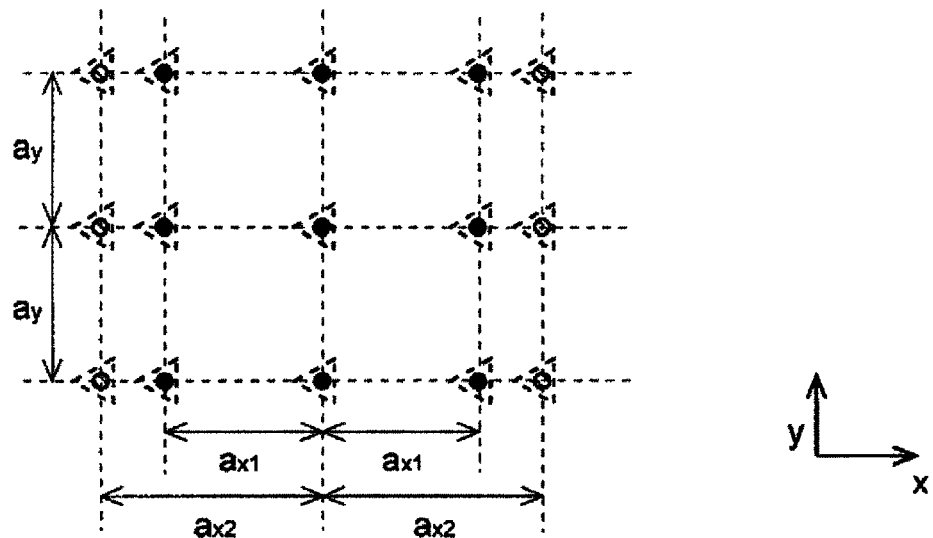
FIGS. 3A and 3B are a schematic diagram showing an example of the two-dimensional lattice arrangement of the photonic crystal layer in the photonic crystal surface emission laser of the comparative example (which is described in Patent Document 1).
Figure 3B:
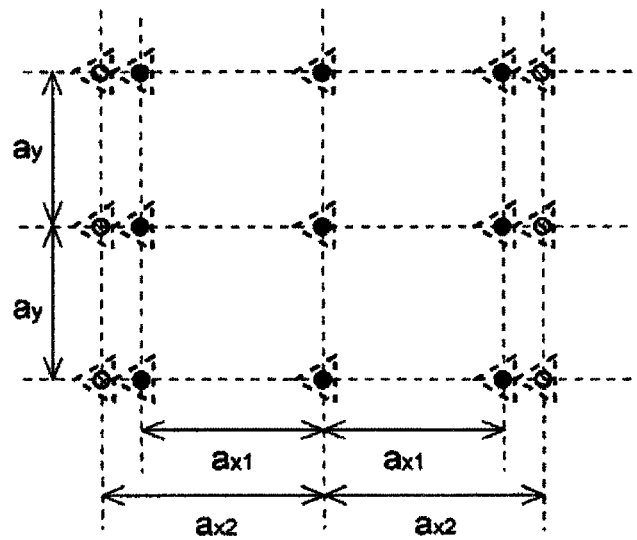

For comparison, the lattice points at which holes are arranged in the two-dimensional photonic crystal laser described in Patent Document 1 are shown in FIGS. 3A and 3B. FIG. 3A illustrates a comparative example in which a square lattice and a primitive rectangular lattice overlap each other. In this example, the sides of the unit lattices of both the square lattice and the primitive rectangular lattice are of identical length in the y-direction. FIG. 3B illustrates a comparative example in which two primitive rectangular lattices overlap each other, in which the sides of the unit lattices are identical in the y-direction and are different in the x-direction. The photonic crystal surface emission laser of the present embodiment and that of Patent Document 1 emit an oblique beam using the beat generated by the frequency difference of the standing waves of the lights caused by the lattice constant difference in the x-direction ($a_{x1}-a_{x2}$), as described in Patent Document 1.

Next, the advantages of the photonic crystal surface emission laser of the present embodiment compared to those of the comparative examples will now be described with reference to FIGS. 4A, 4B, 5A, and 5B. Since the combination of the square lattice and the primitive rectangular lattice of FIG. 3A is merely a special case of the combination of two primitive rectangular lattices of FIG. 3B, the following description concerning the comparative examples covers only the combination of two primitive rectangular lattices.

FIGS. 4A and 4B show reciprocal spaces respectively corresponding to the real lattice of the present embodiment (FIG. 2C) and that of the comparative examples (FIGS. 3A and 3B). In these figures, the reciprocal lattice points of the two rhombic lattices of the present embodiment, or those of the two primitive rectangular lattices of the comparative examples, are superimposed originating from the center. Three primitive reciprocal lattice vectors of $G_{x1}$, $G_{x2}$ and $G_y$ can be used as the reciprocal lattice vectors in each of the reciprocal spaces because the reciprocal lattice vector $G_y$ in the Γ-$X_2$ direction is the same in both lattices. All the reciprocal vectors are expressed by the total of the integral multiples of the three primitive reciprocal lattice vectors. $G_{x1}'$ and $G_{x2}'$ in FIG. 4B are also reciprocal lattice vectors because they are respectively expressed as $G_{x1}'=G_{x1}-G_y$ and $G_{x2}'=G_{x2}-G_y$ by using the primitive reciprocal lattice vectors.

Subsequently, coupling models (FIGS. 5A and 5B) of fundamental waves will be described, which is the basic principle of laser oscillation in the reciprocal spaces of FIGS. 4A and 4B. There are four fundamental waves in each of these reciprocal spaces. These fundamental waves are connected to each other by reciprocal lattice vectors. When the four fundamental waves are connected with each other, a laser oscillation occurs. The coupling strength (feedback strength) among the fundamental waves at this point in time is expressed by κ(G), which is an essential parameter for a laser oscillation. In the Γ-$X_1$ direction, the connection is made through each one of $G_{x1}$ and $G_{x2}$ (or $G_{x2}'$). Hence, the coupling strengths of the models in FIGS. 5A and 5B are almost identical. On the other hand, the coupling strength in the Γ-$X_2$ direction is a first-order coupling strength κ($G_y$) in FIG. 5A, whereas it is a second-order coupling strength κ($2G_y$) in FIG. 5B. Since the value of a second-order κ is generally larger than that of a first-order κ, the photonic crystal surface emission laser of the present embodiment, in which fundamental waves are formed as shown in FIG. 5A, is better than those of comparative examples. For example, the computational results under the same conditions ($a_{x1}=1.25a_y$, $a_{x2}=1/1.25a_y$, and perfectly circular lattice holes with an atomic packing factor of 12%) was κ($2G_y$)=790 cm$^{-1}$ for the comparative examples, and κ($G_y$)=1640 cm$^{-1}$ for the present embodiments. A larger coupling strength decreases the threshold, which results in a stable oscillation of an intended mode.

The reason why an oblique beam is formed in the photonic crystal surface emission lasers of the present embodiment and Patent Document 1 is that a beat is generated by the frequency difference of the standing waves of light caused by the lattice constant difference in the x-direction ($a_{x1}-a_{x2}$), as previously described. More particularly, a beam having a component of a wave number shift $\Delta k=|G_{x1}-G_{x2}|/2$ in the x-direction in the plane is obliquely emitted. A steep incline of the oblique beam causes it to be totally reflected inside the photonic crystal layer 14, thereby preventing it from exiting the photonic crystal layer 14. A method for preventing this is to give the parameters $a_{x1}$, $a_{x2}$, and $a_y$ for the rhombic lattice so as to satisfy the following inequality:

$$\frac{\left|\frac{1}{a_{x1}}-\frac{1}{a_{x2}}\right|}{\sqrt{\left(\frac{1}{a_{x1}}+\frac{1}{a_{x2}}\right)^2+\left(\frac{2}{a_y}\right)^2}} \leq \frac{1}{n}, \quad (1)$$

where n represents an equivalent refractive index of the photonic crystal layer 14 in a direction perpendicular to the photonic crystal layer 14.

Formula (1) is derived as follows. The following formula (2) holds for the photonic crystal layer 14 and the air by Snell's law:

$$\sin\theta = n \times \sin\theta_{in} \quad (2),$$

where θ represents an angle of refraction on the air side and $\theta_{in}$ represents an angle of refraction on the side of the photonic crystal layer 14.

Since the condition for the oblique beam formed inside the photonic crystal layer 14 to be emitted outside is |sin θ|≤1, the following formula (3) holds by the inequality (2):

$$n \times \sin \theta_{in} \leq 1 \qquad (3).$$

Given that k is the wave number of the oblique beam inside the photonic crystal layer 14 and Δk is the wave number thereof in the in-plane direction, $$\sin\theta_{in} = \frac{\Delta k}{k} \qquad (4)$$

holds. Hence, $$n\frac{\Delta k}{k} \leq 1 \qquad (5)$$

holds. Meanwhile, k and Δk are expressed by the following formulae (6) and (7):

$$k = \sqrt{\left\{\frac{1}{2}\left(\frac{2\pi}{a_{x1}} + \frac{2\pi}{a_{x2}}\right)\right\}^2 + \left(\frac{2\pi}{a_y}\right)^2} \qquad (6)$$

and $$\Delta k = \frac{1}{2}\left|\frac{2\pi}{a_{x1}} - \frac{2\pi}{a_{x2}}\right|. \qquad (7)$$

Therefore, substituting the formulae (6) and (7) into the formula (5) gives the formula (1).

Figure 6A:
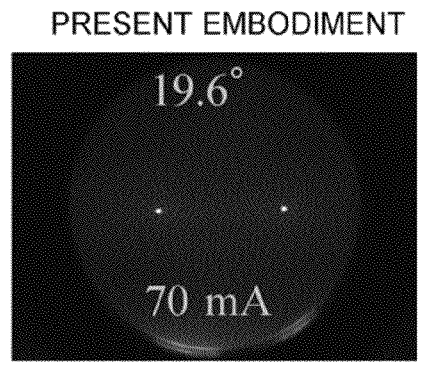
FIGS. 6A and 6C are the data from an experiment showing the relationship between the lattice constant difference and the emission angle from the normal of the emission surface in the photonic crystal surface emission laser of the first embodiment.

The photonic crystal surface emission laser 10 that has the structure shown in FIGS. 1 and 2 was manufactured and its performance was measured. The results were as follows. FIG. 6A shows a measurement result of the oblique beam emitted from the photonic crystal surface emission laser 10 which was manufactured by setting the lattice constants to be $a_y$=590 nm, $a_{x1}$=303 nm, and $a_{x2}$=384 nm so that the designed value of the emission angle θ is 20°. These lattice constants are obtained from the following formulae and inequality (8) through (10) by using the designed value of the emission angle θ, the wavelength λ of the laser to be emitted, and the equivalent refractive index of the photonic crystal layer:

$$a_{x1} = \frac{1}{\sqrt{3}\,r}a_y, \qquad (8)$$

$$a_{x2} = \frac{r}{\sqrt{3}}a_y, \; r > 1,$$

$$a_y = \frac{\lambda}{n}\sqrt{\frac{1}{1 - \left(\frac{\sin\theta}{n}\right)^2}}, \text{ and} \qquad (9)$$

$$r = \frac{2}{\sqrt{3}}\sqrt{\frac{\sin^2\theta}{n^2 - \sin^2\theta}} + \sqrt{\frac{4}{3}\frac{\sin^2\theta}{n^2 - \sin^2\theta} + 1}. \qquad (10)$$

The emission angle of the oblique beam emitted from the manufactured photonic crystal surface emission laser 10 was measured to be 19.6°, which was close to the designed value.

Figure 6B:
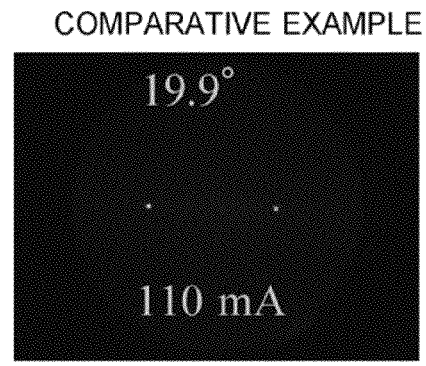
FIGS. 6B and 6D are those of the comparative example.
Figure 6C:
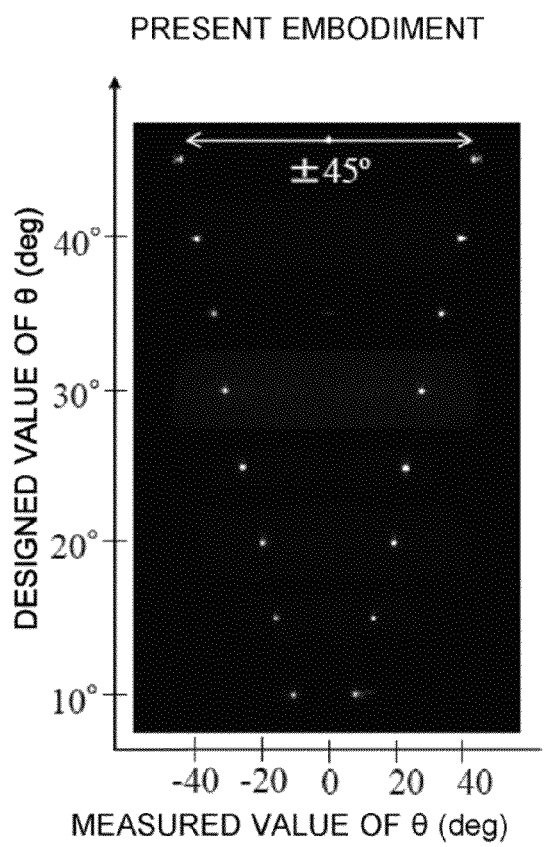
Figure 6D:
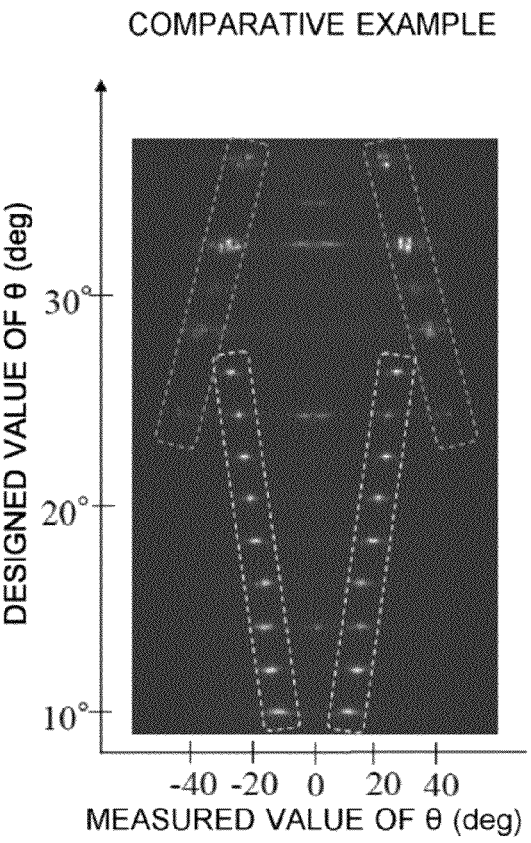

As a comparative example, a photonic crystal surface emission laser was manufactured in which holes were arranged on the lattice points of the lattice in which a square lattice and a primitive rectangular lattice overlap each other. The oblique beam emitted from this laser was measured (FIG. 6B). In this comparative example, the lattice constants of the square lattice were set to be $a_{x1}$=$a_y$=295 nm, and those of the primitive rectangular lattice were set to be $a_{x2}$=372 nm and $a_y$=295 nm. These lattice constants were determined so that the designed value of the emission angle θ would be 20°. The actual measurement value of the emission angle θ was 19.9°.

The threshold measured in the comparative example was approximately 110 mA, whereas it's measurement in the present embodiment was approximately 70 mA, which was smaller than the threshold of the comparative example. This is probably due to the fact that the coupling strength in the present embodiment is greater than that of the comparative example.

In the present embodiment (FIG. 6C) and the comparative example (FIG. 6D), multiple photonic crystal surface emission lasers with different designed values of the emission angle θ were manufactured and the emitted oblique beam was measured. In the comparative example, the actual measurement values are well matched to the designed values where the designed values of the emission angle θ are of a relatively small range, whereas the actual measurement values are smaller than the designed values where the designed values are of a range of 30° or more, i.e. they are not in agreement with each other. This is probably because the photonic crystal surface emission laser did not actually cause an oscillation due to the high threshold of the oscillation mode that corresponds to the designed value, and caused an oscillation in an undesired mode. Even with the designed value of not more than 30°, both an oblique beam having an oblique angle as designed and an oblique beam caused by an undesired oscillation mode was emitted. In addition, an oscillation in an undesired mode with an actual measurement value of the emission angle of approximately 0° was observed. Conversely, in the photonic crystal surface emission laser of the present embodiment, it was confirmed that an oblique beam having an emission angle as designed can be obtained throughout the range of between 0° and 45°. This is probably because the threshold of the oscillation in a desired mode in the present embodiment was smaller than that of the comparative example, so the oscillation in that mode was easily caused.

Figure 7A:
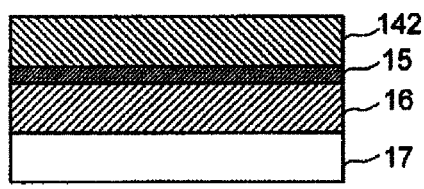
FIGS. 7A through 7D are vertical sectional views showing the method of manufacturing the photonic crystal surface emission laser of the first embodiment.
Figure 7B:
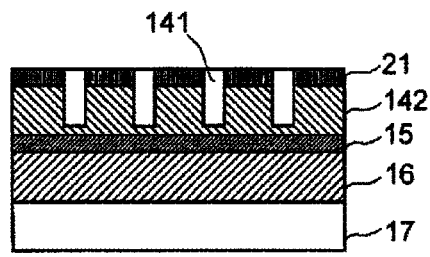
Figure 7C:
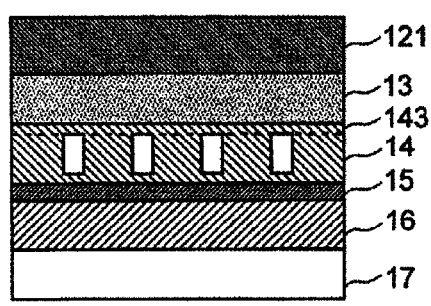
Figure 7D:
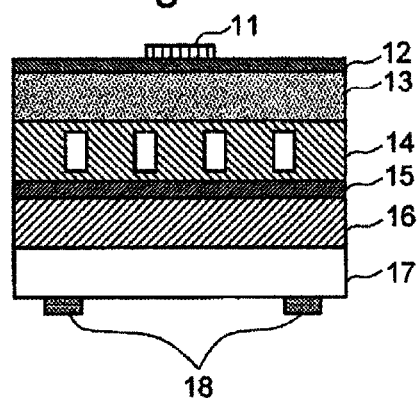
Figure 8:
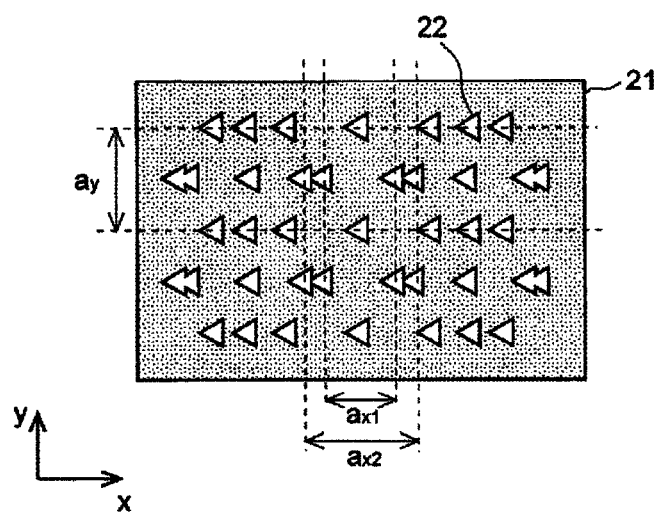
FIG. 8 is a top view showing the state in which a pattern is plotted on the resist used in the method of manufacturing the photonic crystal surface emission laser of the first embodiment.

Next, the manufacturing method of the photonic crystal surface emission laser 10 will be described with reference to FIGS. 7 and 8. First, the second cladding layer 16, the active layer 15, and the slab 142 are layered in this order on the upper substrate 17 by metal organic chemical vapor deposition (MO-CVD) or another method (FIG. 7A). The holes 141 have not yet been formed on the slab 142. Then, a resist 21 is applied onto the slab 142 so as to print a resist pattern (FIG. 8) in which equilateral triangular holes 22 are arranged on the lattice points of the lattice in which the first rhombic lattice and the second rhombic lattice overlap each other (FIG. 2C). Then, the slab 142 is etched through the holes 22 by using chemical vapor deposition (CVD) or any other method to form the holes 141 on the slab 142. Thereby, the photonic crystal layer 14 is manufactured.

Separately, the first cladding layer 13 and a fusing layer 143, which is made of the same material as that of the slab 142, are layered in that order on the second substrate 121. Then, the layered photonic crystal layer 14 and the fusing layer 143 are heated so as to fusion-bond these layers (FIG. 7C). Next, the second substrate 121 is mirror-polished to a predetermined thickness. The second substrate 121 after the thickness reduction serves as the lower substrate 12. Further, the back electrode 11 and the window-like electrode 18 are respectively formed on the lower substrate 12 and on the upper substrate 17 by using a vapor-deposition technic or any other method. Consequently, the photonic crystal surface emission laser 10 is obtained (FIG. 7D).

Second Embodiment

The photonic crystal surface emission laser 30 of the second embodiment will be described with reference to FIGS. 9 through 11.

FIG. 9 is a vertical sectional view of the photonic crystal surface emission laser 30. The photonic crystal surface emission laser 30 is manufactured by layering, in this order, a back electrode 31, a lower substrate 32, a first cladding layer 33, a photonic crystal layer 34, an active layer 35, a second photonic crystal layer 36, a second cladding layer 37, an upper substrate 38, and a window-like electrode 39. Thus, the present embodiment is different from the first embodiment in that the photonic crystal surface emission laser 30 has two photonic crystal layers, i.e. the first photonic crystal layer 34 and the second photonic crystal layer 36. In the present embodiment, the first photonic crystal layer 34 and the second photonic crystal layer 36 are provided so as to sandwich the active layer 35. However, both the first photonic crystal layer 34 and the second photonic crystal layer 36 may be provided on the same side in respect to the active layer 35.

The first photonic crystal layer 34 includes holes 341 arranged on the aforementioned lattice points 191A of the first rhombic lattice 19A, and the second photonic crystal layer 36 includes holes 361 arranged on the aforementioned lattice points 191B of the second rhombic lattice 19B. If the holes of these two photonic crystal layers are projected onto a plane that is parallel to these layers, the lattice points on which the holes are placed are arranged in the same manner as the lattice points (FIG. 2C) of the photonic crystal layer 14 in the first embodiment.

The materials of the back electrode 31, the lower substrate 32, the first cladding layer 33, the active layer 35, the second cladding layer 37, the upper substrate 38, and the window-like electrode 39 may be the same as those of the back electrode 11, the lower substrate 12, the first cladding layer 13, the active layer 15, the second cladding layer 16, the upper substrate 17 and the window-like electrode 18 in the first embodiment, respectively. The materials of the slab (the first slab 342) in the first photonic crystal layer 34 and the slab (the second slab 362) in the second photonic crystal layer 36 may be the same as the material of the slab 142 in the first embodiment. In addition, the modified refractive index area may be used in place of the holes 341 in the first photonic crystal layer 34 and the holes 361 in the second photonic crystal layer 36 as in the first embodiment.

The above-described photonic crystal layer of the photonic crystal surface emission laser 30 of the present embodiment has a different structure to that of the photonic crystal surface emission laser 10 of the first embodiment, but it operates in the same way.

The manufacturing method of the photonic crystal surface emission laser 30 will now be described with reference to FIGS. 10A through 10H and FIGS. 11A through 11C. FIGS. 10A through 10H are vertical sectional views showing the present manufacturing method, and FIGS. 11A through 11C are top views showing the state in which a pattern is plotted on the resist used in the present manufacturing method.

Figure 10A:
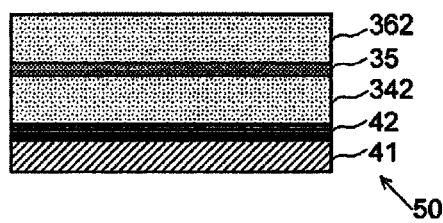
FIGS. 10A through 10H are vertical sectional views showing the method of manufacturing the photonic crystal surface emission laser of the second embodiment.
Figure 10B:
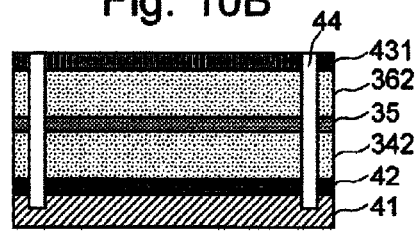
Figure 10C:
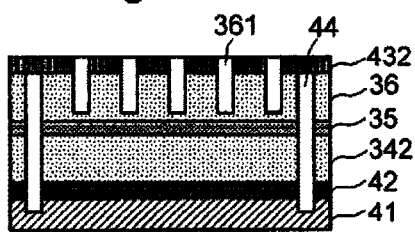
Figure 11A:
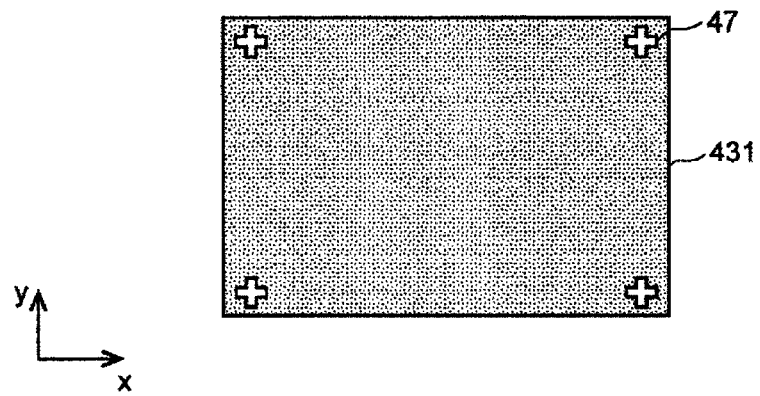
FIGS. 11A through 11C are top views showing the state in which a pattern is plotted on the resist used in the method of manufacturing the photonic crystal surface emission laser of the second embodiment.
Figure 11B:
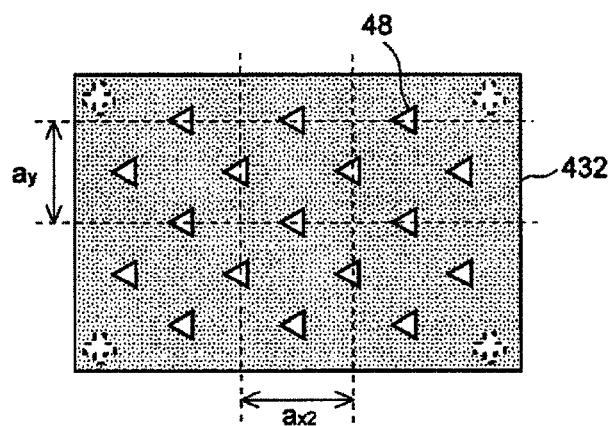
Figure 11C:
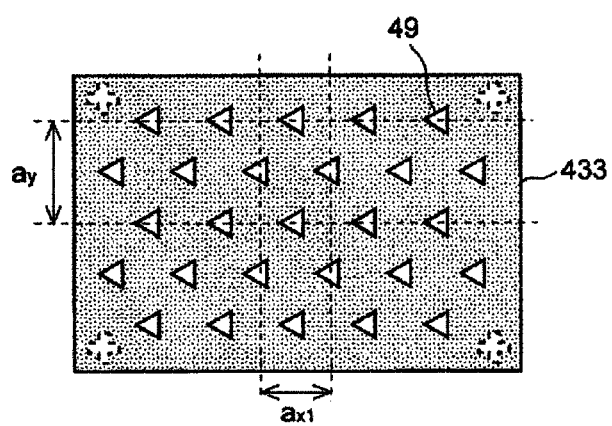

First, a first layered body 50 is manufactured in which an etch stop layer 42, the first slab 342, the active layer 35, and the second slab 362 are layered in this order (FIG. 10A). The materials and characteristics of a manufacturing substrate 41 and the etch stop layer 42 will be described later. Next, a first resist 431 is applied onto the second slab 362, and cross marks 47 are plotted on the four corners of the first resist 431 (FIG. 11A). Then, the layered body 50 is etched through the cross marks 47 to form positioning marks 44 which penetrate through the layered body 50 (FIG. 10B). Next, the first resist 431 is removed and a second resist 432 is applied onto the second slab 362. The pattern of holes 48, which corresponds to the arrangement of the holes 361 on the lattice points 191B of the second rhombic lattice 19B, is plotted on the second resist 432 (FIG. 11B). The second slab 362 is etched through the holes 48 to form holes 341 in the second slab 362 so as to manufacture the second photonic crystal layer 36 (FIG. 10C). After that, the second resist 432 is removed.

Figure 10D:
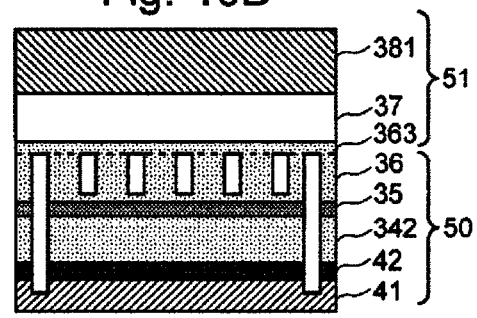
Figure 10E:
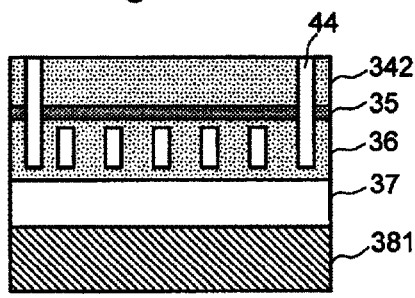

Separately, the second cladding layer 37 and a second fusing layer 363, which is made of the same material as that of the second slab 362, are layered in this order on a second substrate 381 to form a second layered body 51. Then, the second photonic crystal layer 36 of the first layered body 50 and the second fusing layer 363 are overlapped with each other and then thermally fusion-bonded (FIG. 10D). Next, the manufacturing substrate 41 is removed using a polishing method and a wet etching method. Further, the etch stop layer 42 is removed with another etching agent (FIG. 10E). The etch stop layer 42 may be composed of a material which is etched slower than the manufacturing substrate 41 by means of some other etching liquid rather than being etched with the etching liquid for the manufacturing substrate 41.

Figure 10F:
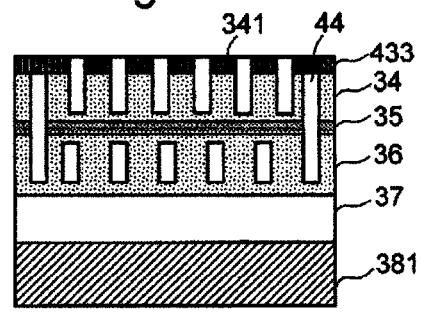

Next, a third resist 433 is applied onto the surface of the first slab 342 which has been exposed as a result of the removal of the manufacturing substrate 41 and the etch stop layer 42. Then, holes 49 are formed in the third resist 433 at the points corresponding to the lattice points 191A of the first rhombic lattice 19A so that the holes 361 and the holes 341 are aligned in the y-direction, based on the positions of the positioning marks 44 which can be seen through the third resist 433 (FIG. 11C). Subsequently, the first slab 342 is etched through the holes 49 to form the holes 341 to manufacture the first photonic crystal layer 34 (FIG. 10F). After that, the third resist 433 is removed.

Figure 10G:
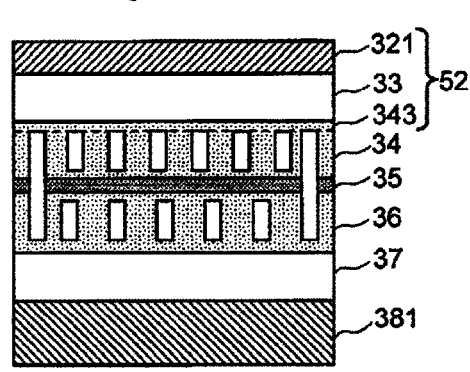
Figure 10H:
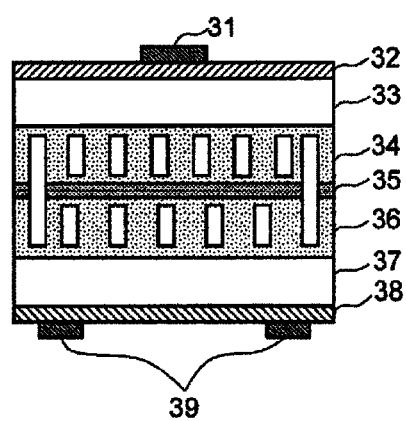

Separately, the first cladding layer 33 and a first fusing layer 343 which is made of the same material as the first slab 342 are formed in this order on a first substrate 321 to form a third layered body 52. The third layered body 52 is placed on the first photonic crystal layer 34 so that the first fusing layer 343 and the first photonic crystal layer 34 overlap each other. Then, the first fusing layer 343 and the first photonic crystal layer 34 are thermally fusion-bonded (FIG. 10G). After that, the first substrate 321 and the second substrate 381 are mirror-polished to a predetermined thickness. Then, the back electrode 31 is formed on the surface of the first substrate 321, and the window-like electrode 39 is formed on the surface of the second substrate 381 to obtain the photonic crystal surface emission laser 30 of the second embodiment (FIG. 10H).

Third Embodiment

Figure 12A:
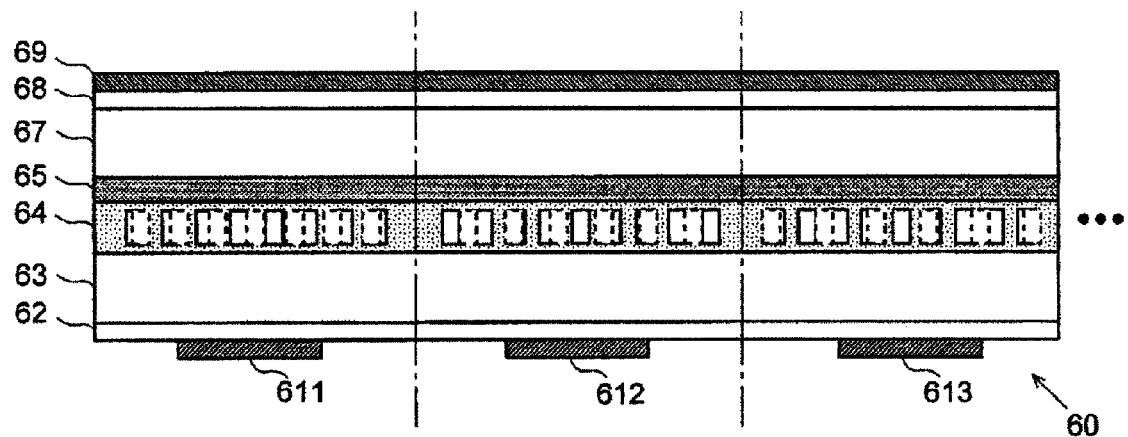
FIG. 12A is a vertical sectional view of an emitting direction variable photonic crystal surface emission laser, which is the third embodiment of the photonic crystal surface emission laser according to the present invention.
Figure 12B:
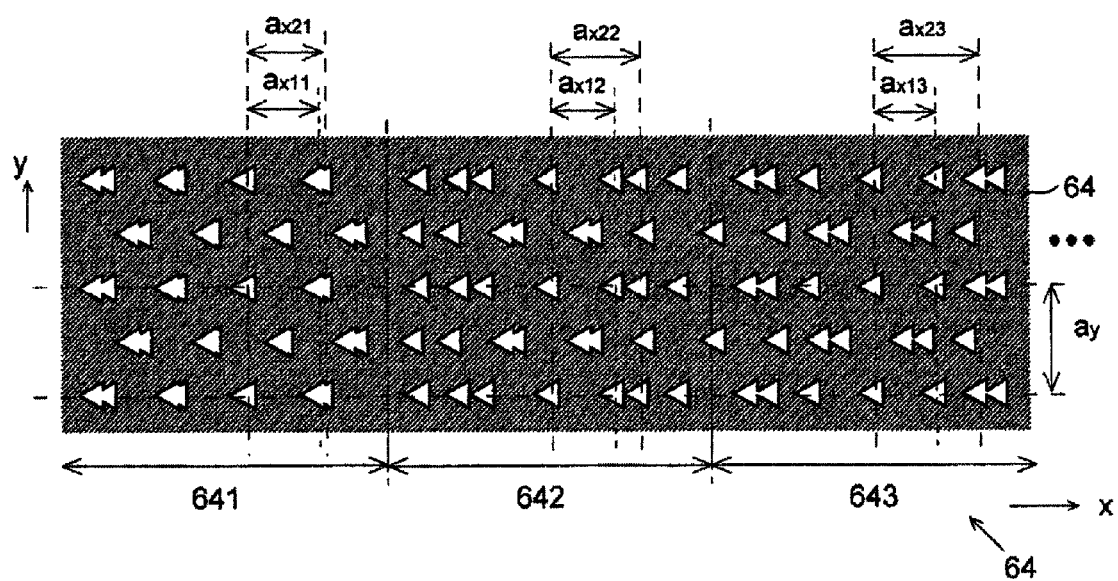
FIG. 12B is a top view showing the change of the period in the photonic crystal layer.

The photonic crystal surface emission laser 60 of the third embodiment will now be described with reference to FIGS. 12A and 12B. The photonic crystal surface emission laser 60 of the present embodiment is an example of the aforementioned emitting direction variable photonic crystal surface emission laser. The emitting direction variable photonic crystal surface emission laser 60 is composed of a back electrode $611, 612, 613, \ldots, 61S_{max}$ (where $S_{max}$ is an integer. The back electrode $61S_{max}$ is not shown), a lower substrate 62, a first cladding layer 63, a photonic crystal layer 64, an active layer 65, a second cladding layer 66, an upper substrate 67, and a transparent electrode 68, which are layered in that order.

The photonic crystal layer 64 is composed of one slab which includes a first modified period area 641, a second modified period area 642, a third modified period area

643, ... and an $S_{max}{}^{th}$ modified period area 64S$_{max}$ (the $S_{max}{}^{th}$ modified period area 64S$_{max}$ is not shown). In each of the modified period areas, as in the photonic crystal layer of the first embodiment, holes are placed on the lattice points of the lattice in which the first rhombic lattice and the second rhombic lattice overlap each other. Comparing the unit lattices of the first and second rhombic lattices, the diagonals in the x-direction are different in length, and those in the y-direction are the same in length ($a_y$). The length of the diagonals in the x-direction of both the first rhombic lattice and the second rhombic lattice is different in every modified period area. The lengths of the diagonals in the x-direction are $a_{x1s}$ and $a_{x2s}$ in the $S^{th}$ modified period area 64S (S=1, 2, 3, ..., and $S_{max}$), and $a_{x1s}$ and $a_{x2s}$ satisfy the following formulae and inequality (11):

$$a_{x1s} = \frac{1}{\sqrt{3}\, r_s} a_y,\ a_{x2s} = \frac{r_s}{\sqrt{3}} a_y,\ r_s > 1. \tag{11}$$

Increasing the value of S increases the value of r.

The back electrodes 611, 612, 613, ..., and 61S$_{max}$ are respectively provided immediately below the first modified period area 641, the second modified period area 642, the third modified period area 643, ... and the $S_{max}{}^{th}$ modified period area 64S$_{max}$.

In the emitting direction variable photonic crystal surface emission laser 60 of the present embodiment, applying a voltage between any one of the back electrodes 611, 612, 613, ..., and 61S$_{max}$ and the transparent electrode 68 injects an electric current to a part of the active layer, which is located immediately above the back electrode, and the light emission from that part is amplified in the $S^{th}$ modified period area 64S, which is located immediately above that part. Consequently, an oblique beam is emitted at an emission angle of $\theta_S$, which is determined by the lengths of the diagonals in the x-direction of the two rhombic lattices in the $S^{th}$ modified period area 64S. Since the lengths of the diagonals in the x-direction of the two rhombic lattices are different in every modified period area as previously described, the emission angle $\theta_S$ differs in every modified period area, i.e. every back electrode for the injection of electric current. In this manner, it is possible to obtain oblique beams with a different emission angle $\theta_S$ from an emitting direction variable photonic crystal surface emission laser 60.

The emitting direction variable photonic crystal surface emission laser 60 of the present invention can be manufactured in the same manner for the photonic crystal surface emission laser 10 of the first embodiment.

In the third embodiment, the lengths of the diagonals in the x-direction in the first and second rhombic lattices are determined so as to satisfy the formula (11). However, the present invention is not limited thereto. For example, the length of the diagonals in the x-direction of either one of the first rhombic lattice and the second rhombic lattice may be different in the modified period areas, and that of the other rhombic lattice may be the same in all the modified period areas (FIG. 13).

The length of the diagonal in the y-direction may be different in every modified period area (FIG. 14). However, in one modified period area, the diagonals in the y-direction in both the first rhombic lattice and the second rhombic lattice are of equal length. Hereinafter, $a_{ys}$ is assumed as the length of the diagonals in the y-direction in the $S^{th}$ modified period area 64S of the first rhombic lattice and the $S^{th}$ modified period area 66S of the second rhombic lattice. In this case, it is preferable that $a_{x1s}$, $a_{x2s}$, $a_{ys}$, and r satisfy the following formulae and inequality (12) through (14) with the emission angle $\theta$ and the wavelength $\lambda$ of the oblique beam to be emitted:

$$a_{x1s} = \frac{1}{\sqrt{3}\, r_s} a_{ys},\ a_{x2s} = \frac{r_s}{\sqrt{3}} a_{ys},\ r_s > 1, \tag{12}$$

$$a_{ys} = \frac{\lambda}{n} \sqrt{\frac{1}{1 - \left(\frac{\sin\theta_s}{n}\right)^2}},\ \text{and} \tag{13}$$

$$r_s = \frac{2}{\sqrt{3}} \sqrt{\frac{\sin^2\theta_s}{n^2 - \sin^2\theta_s}} + \sqrt{\frac{4}{3} \frac{\sin^2\theta_s}{n^2 - \sin^2\theta_s} + 1}. \tag{14}$$

When these formulae (12) through (14) are satisfied, it is possible to obtain an oblique beam having the same wavelength $\lambda$ at a different emission angle $\theta$ depending on the position into which an electric current is injected.

Fourth Embodiment

Figure 15A:
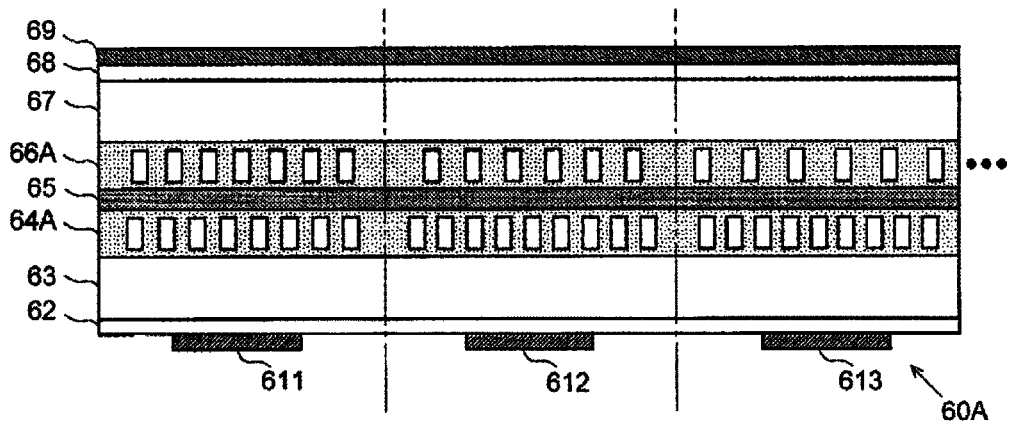
FIG. 15A is a vertical sectional view of an emitting direction variable photonic crystal surface emission laser, which is the fourth embodiment of the photonic crystal surface emission laser according to the present invention.
Figure 15B:
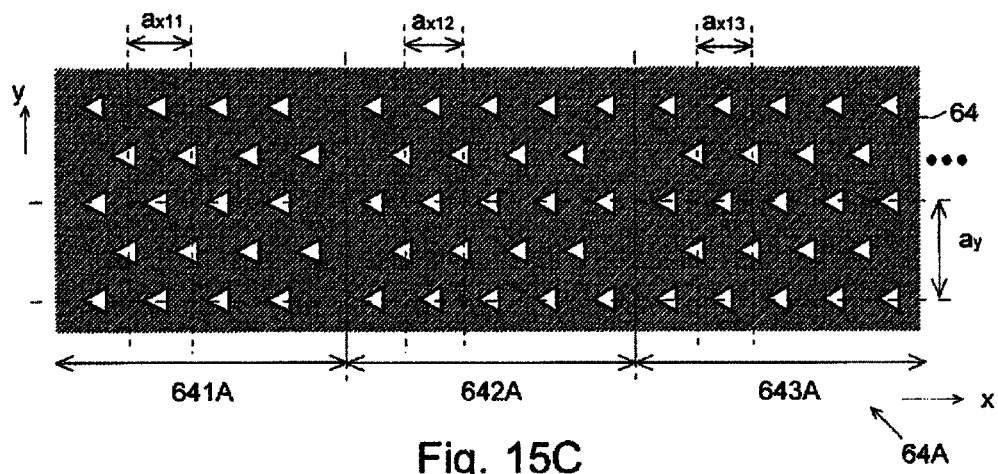
FIG. 15B is a top view showing the change of the period in the first rhombic lattice in the photonic crystal layer.
Figure 15C:
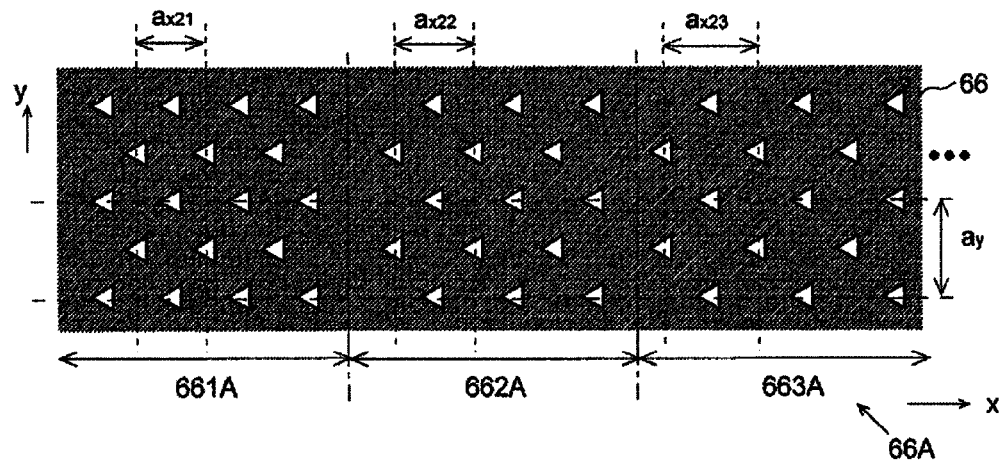
FIG. 15C is a top view showing the change of the period in the second rhombic lattice in the photonic crystal layer.

In the emitting direction variable photonic crystal surface emission laser 60 of the third embodiment, only one photonic crystal layer having a lattice in which two rhombic layers overlap each other is provided as in the first embodiment. However, two photonic crystal layers may be provided as in the second embodiment. FIGS. 15A through 15C show that example (the fourth embodiment). The emitting direction variable photonic crystal surface emission laser 60A of the fourth embodiment has a first photonic crystal layer 64A on one side of the active layer 65, and a second photonic crystal layer 66A on the other side. The first photonic crystal layer 64A is composed of a slab including a first modified period area 641A, a second modified period area 642A, a third modified period area 643A, ..., and an $S_{max}{}^{th}$ modified period area 64S$_{max}$A (which is not shown). Each modified period area has holes provided on the lattice points of a rhombic lattice with a unit lattice in which the length of the diagonal in the x-direction is $a_{x1s}$, and that of the diagonal in the y-direction is $a_y$. The second photonic crystal layer 66A is composed of a slab including a first modified period area 661A, a second modified period area 662A, a third modified period area 663A, ..., and an $S_{max}{}^{th}$ modified period area 66S$_{max}$A (which is not shown), which are immediately above the corresponding modified period areas of the first photonic crystal layer 64A. Each modified period area has holes provided on the lattice points of a rhombic lattice with a unit lattice in which the length of the diagonal in the x-direction is $a_{x2s}$, and that of the diagonal in the y-direction is $a_y$. The relationship in the formula (11) is satisfied by $a_{x1s}$ and $a_{x2s}$, which also satisfies the relationship in which increasing the value of S increases the value of r in the formula (11). As in the third embodiment, the relationship among $a_{x1s}$, $a_{x2s}$, and $a_y$ is not limited to that which relates to the formula (11), as the relationships such as those shown in FIG. 13 and FIG. 14 can be used also.

The emitting direction variable photonic crystal surface emission laser 60A of the fourth embodiment operates in the same manner as the emitting direction variable photonic crystal surface emission laser 60 of the third embodiment. The emitting direction variable photonic crystal surface emission laser 60A can be manufactured in the same manner as the emitting direction variable photonic crystal surface emission laser 30 of the second embodiment.

Fifth Embodiment

Figure 16A:
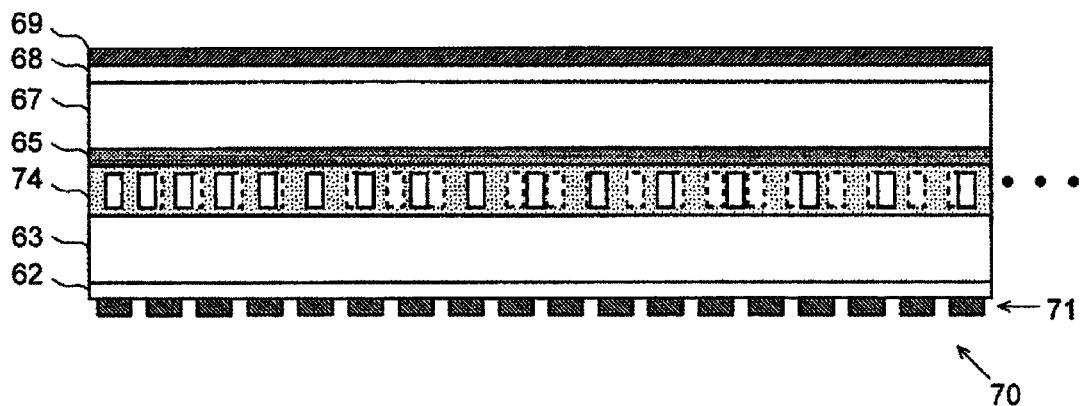
FIG. 16A is a vertical sectional view of an emitting direction variable photonic crystal surface emission laser, which is the fifth embodiment of the photonic crystal surface emission laser according to the present invention.
Figure 16B:
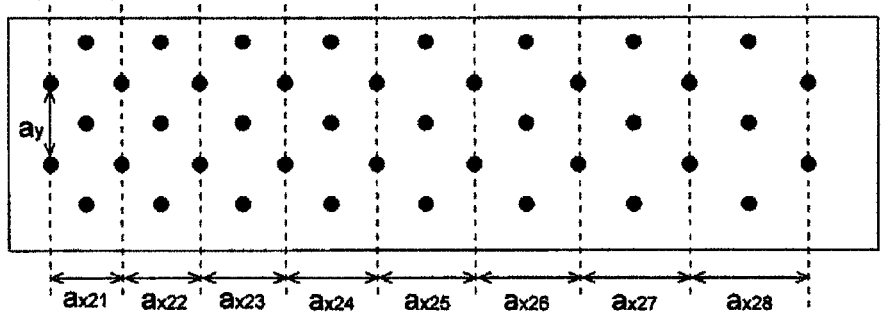
FIGS. 16B and 16C are top views showing the period in the photonic crystal layer.
Figure 16C:
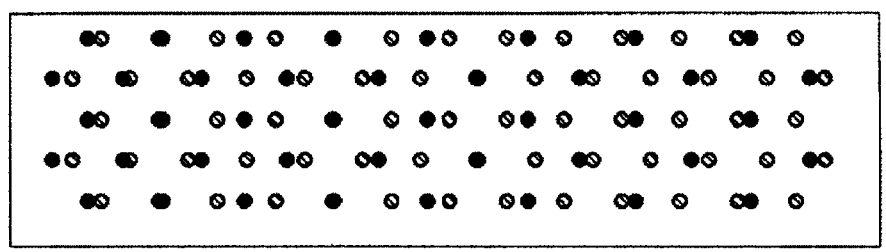

An emitting direction variable photonic crystal surface emission laser 70 of the fifth embodiment will now be described with reference to FIGS. 16A through 16C. The emitting direction variable photonic crystal surface emission laser 70 of the present embodiment has the same structure as the emitting direction variable photonic crystal surface emission laser 60 of the third embodiment, excepting the photonic crystal layer 74 and the back electrode 71. Explanations for structures that are the same those of the third embodiment have been omitted. The photonic crystal layer 74 includes holes on the lattice points of the lattice 741 (FIG. 16C) in which the first rhombic-like lattice 741A and the second rhombic-like lattice 741B overlap each other (FIG. 16B). In the entire first rhombic-like lattice 741A, the length of the diagonals in the x-direction is $a_{x1}$, and that in the y-direction is $a_y$. Hence, the first rhombic-like lattice 741A is a normal rhombic lattice. On the other hand, in the second rhombic-like lattice 741B, the length of the diagonals in the y-direction is $a_y$ throughout the lattice, whereas the length of the diagonals in the x-direction gradually increases in the positive direction. Therefore, the second rhombic-like lattice 741B is not a rhombic lattice because it is not translationally symmetric and the quadrilateral formed by the four lattice points that correspond to the unit lattice of a rhombic lattice has a shape of a rhombus distorted in the x-direction. This is the reason why this lattice is called a "rhombic-like lattice." The back electrode 71 is composed of a number of unit back electrodes 711, 712, 713, 714, . . . , aligned in the x-direction, each of which is narrower that of the back electrodes of the third embodiment.

In the emitting direction variable photonic crystal surface emission laser 70, applying a voltage between multiple adjacent unit back electrodes and the transparent electrode 68 injects an electric current to a part of the active layer, which is located immediately above the unit back electrodes, and the light emission from that part is amplified in a part of the photonic crystal layer 74. Consequently, an oblique beam is emitted at an emission angle θ, which is determined by the difference between the length of the diagonal of the first rhombic-like lattice 741A and that of the second rhombic-like lattice 741B in the aforementioned part of the photonic crystal layer 74. Changing the unit back electrodes used for the electric current injection moves the part of the active layer into which the current is injected, as well as the part of the photonic crystal layer 74 where the light is amplified, which consequently changes the emission angle of the oblique beam. If a current injection from the unit back electrode at one end of the aforementioned multiple adjacent unit back electrodes is halted and an electric current is injected from the unit back electrode which is adjacent to the unit back electrode at the other end of the multiple adjacent unit back electrodes, the current injection portion can be slightly moved. This allows fine-tuning of the emission angle θ.

For example, as shown in FIG. 17A, applying a voltage between the adjacent unit back electrodes 711, 712, and 713 and the transparent electrode 68 injects an electric current into the area 65A immediately thereabove, and the light is amplified in the photonic crystal layer 74 in the area 65A. When the application of the voltage between the unit back electrode 711 and the transparent electrode 68 is halted as shown in FIG. 17B, and a voltage is newly applied between the unit back electrode 714 which is adjacent to the unit back electrode 713 in the positive x-direction and the transparent electrode 68, the area 65A into which the electric current is injected is moved. The light is amplified in the area 65A in the photonic crystal layer 74. Since the length of the diagonals in the photonic crystal layer 74 in the area 65A is different between the two states, the oblique beam is emitted at a different emission angle.

Sixth Embodiment

The emitting direction variable photonic crystal surface emission laser 80 of the sixth embodiment will be described with reference to FIG. 18. The emitting direction variable photonic crystal surface emission laser 80 of the present embodiment has the same structure as the emitting direction variable photonic crystal surface emission laser 70 of the fifth embodiment, except that the first photonic crystal 84 and the second photonic crystal layer 86 are respectively provided below and above the active layer 65. The first photonic crystal layer 84 includes holes arranged in the same period as in the first rhombic-like lattice 741A of the fifth embodiment. The second photonic crystal layer 86 includes holes arranged in the same period as in the second rhombic-like lattice 741B of the fifth embodiment. Explanations for other structures that are the same as those of the fifth embodiment have been omitted. The emitting direction variable photonic crystal surface emission laser 80 of the present embodiment operates in the same way as the emitting direction variable photonic crystal surface emission laser 70 of the fifth embodiment.

EXPLANATION OF NUMERALS 10, 30 . . . Photonic Crystal Surface Emission Laser
11, 31, 611, 612, 613, 61S, 61Smax, 71 . . . Back Electrode
12, 32, 62 . . . Lower Substrate
121 . . . Second Substrate
13, 33, 63 . . . First Cladding Layer
14, 64, 74 . . . Photonic Crystal Layer
141, 341, 361 . . . Hole
142 . . . Slab
143 . . . Fusing Layer
15, 35, 65 . . . Active Layer
16, 37, 66 . . . Second Cladding Layer
17, 38, 67 . . . Upper Substrate
18, 39 . . . Window-Like Electrode
19A . . . First Rhombic Lattice
19B . . . Second Rhombic Lattice
191A, 191B . . . Lattice Point
192A . . . First Unit Lattice
192B . . . Second Unit Lattice
21 . . . Resist
22, 48, 49 . . . Hole of Resist
251, 47 . . . Cross Mark
321 . . . First Substrate
34, 64A, 84 . . . First Photonic Crystal Layer
342 . . . First Slab
343 . . . First Fusing Layer
36, 66A, 86 . . . Second Photonic Crystal Layer
362 . . . Second Slab
363 . . . Second Fusing Layer
381 . . . Second Substrate
41 . . . Manufacturing Substrate
42 . . . Etch Stop Layer
431 . . . First Resist
432 . . . Second Resist
433 . . . Third Resist
44 . . . Positioning Mark
50 . . . First Layered Body
51 . . . Second Layered Body
60, 60A, 70, 80 . . . Emitting Direction Variable Photonic Crystal Surface Emission Laser
641, 641A, 661A . . . First Modified Period Area
642, 642A, 662A . . . Second Modified Period Area
643, 643A, 663A . . . Third Modified Period Area
64S, 66S . . . $S^{th}$ Modified Period Area 64Smax, 64SmaxA, 66SmaxA . . . Smax$^{th}$ Modified Period Area
65A . . . Area
68 . . . Transparent Electrode
711, 712, 713, 714 . . . Unit Back Electrode
741 . . . Lattice
741A . . . First Rhombic-Like Lattice
741B . . . Second Rhombic-Like Lattice

The invention claimed is:

1. A photonic crystal surface emission laser, comprising:
an active layer; and
a photonic crystal layer made of a plate-shaped slab provided with modified refractive index areas having a refractive index different from that of the slab, the modified refractive index areas being arranged on each of lattice points of a first rhombic-like lattice and a second rhombic-like lattice in which two diagonals are respectively parallel and only one of the two diagonals has different lengths, wherein:
$a_{x1}$, $a_{x2}$, $a_y$, and n satisfy a following inequality:

$$\frac{\left|\frac{1}{a_{x1}} - \frac{1}{a_{x2}}\right|}{\sqrt{\left(\frac{1}{a_{x1}} + \frac{1}{a_{x2}}\right)^2 + \left(\frac{2}{a_y}\right)^2}} \leq \frac{1}{n},$$

where $a_{x1}$ and $a_y$ respectively represent a length of aforementioned one of the two diagonals having different lengths and that of an other one of the two diagonals of the first rhombic-like lattice, $a_{x2}$ ($a_{x2} \neq a_{x1}$) and $a_y$ respectively represent a length of the aforementioned one of the two diagonals having different lengths and that of an other one of the two diagonals of the second rhombic-like lattice, and n represents an equivalent refractive index of the photonic crystal layer in a direction perpendicular to the photonic crystal layer.

2. A photonic crystal surface emission laser, comprising:
an active layer;
a first photonic crystal layer made of a plate-shaped slab provided with modified refractive index areas having a refractive index different from that of the slab, the modified refractive index areas being arranged on lattice points of a first rhombic-like lattice; and
a second photonic crystal layer made of a plate-shaped slab provided with modified refractive index areas arranged on a second rhombic-like lattice in which two diagonals are parallel to those of the first rhombic-like lattice and a length of only one of the two diagonals is different from that of the first rhombic-like lattice, wherein:
$a_{x1}$, $a_{x2}$, $a_y$, and n satisfy a following inequality:

$$\frac{\left|\frac{1}{a_{x1}} - \frac{1}{a_{x2}}\right|}{\sqrt{\left(\frac{1}{a_{x1}} + \frac{1}{a_{x2}}\right)^2 + \left(\frac{2}{a_y}\right)^2}} \leq \frac{1}{n},$$

where $a_{x1}$ and $a_y$ respectively represent a length of the aforementioned one of the two diagonals having a different length and that of an other one of the two diagonals of the first rhombic-like lattice, $a_{x2}$ ($a_{x2} \neq a_{x1}$) and $a_y$ respectively represent a length of the aforementioned one of the two diagonals having a different length and that of an other one of the two diagonals of the second rhombic-like lattice, and n represents an equivalent refractive index of the first photonic crystal layer and the second photonic crystal layer in a direction perpendicular to the first photonic crystal layer and the second photonic crystal layer.

3. The photonic crystal surface emission laser according to claim 2, wherein the first photonic crystal layer and the second photonic crystal layer are provided on a same side of the active layer.

4. The photonic crystal surface emission laser according to claim 2, wherein the first photonic crystal layer and the second photonic crystal layer are provided so as to sandwich the active layer.

5. The photonic crystal surface emission laser according to claim 1, wherein $a_{x1}$, $a_{x2}$, and $a_y$ satisfy following formulae and inequality:

$$a_{x1} = \frac{1}{\sqrt{3}\,r} a_y,$$
$$a_{x2} = \frac{r}{\sqrt{3}} a_y, \, r > 1.$$

6. The photonic crystal surface emission laser according to claim 1, wherein:
the length of the one of the two diagonals having different lengths in the first rhombic-like lattice and/or the second rhombic-like lattice differs according to a position in a direction in which the diagonals having different lengths extend, and the photonic crystal surface emission laser comprises:
an electric current injection unit capable of injecting an electric current into only a portion of the active layer and changing an injection position of the electric current in the direction of the diagonals.

7. The photonic crystal surface emission laser according to claim 6, the first rhombic-like lattice and/or the second rhombic-like lattice have a plurality of modified period areas in which the length of one of the two diagonals having different lengths differs in every modified period area.

8. The photonic crystal surface emission laser according to claim 6, wherein the length of the one of the two diagonals having different lengths in the first rhombic-like lattice or the second rhombic-like lattice changes continuously.

9. The photonic crystal surface emission laser according to claim 1, comprising:
a plurality of modified period areas in which the length of one of the two diagonals having different lengths and the length of the other one of the two diagonals in the first rhombic-like lattice and/or the second rhombic-like lattice differ according to a position in a direction in which the one of the two diagonals and in a direction in which the other one of the two diagonals extend; and
an electric current injector capable of injecting an electric current into only a part of the active layer and changing an injection position of the electric current in the direction of the diagonals.

10. The photonic crystal surface emission laser according to claim 9 which satisfies following formulae and inequality:

$$a_{x1s} = \frac{1}{\sqrt{3}\,r_s} a_{ys}, \, a_{x2s} = \frac{r_s}{\sqrt{3}} a_{ys}, \, r_s > 1,$$

-continued $$a_{ys} = \frac{\lambda}{n} \sqrt{\frac{1}{1-\left(\frac{\sin\theta_s}{n}\right)^2}}, \text{ and}$$

$$r_s = \frac{2}{\sqrt{3}} \sqrt{\frac{\sin^2\theta_s}{n^2 - \sin^2\theta_s}} + \sqrt{\frac{4}{3}\frac{\sin^2\theta_s}{n^2 - \sin^2\theta_s} + 1},$$

where $a_{x1s}$ and $a_{ys}$ respectively represent the length of one of the two diagonals having different lengths and the length of the other one of the two diagonals of the first rhombic-like lattice, $a_{x2s}(a_{x2s} \neq a_{x1s})$ and $a_y$, respectively represent the length of one of the two diagonals having different lengths and the length of the other one of the two diagonals of the second rhombic-like lattice, and $\theta_S$ and $\lambda$ respectively represent an emission angle and a wavelength of a beam emitted outside.

11. The photonic crystal surface emission laser according to claim 2, wherein $a_{x1}$, $a_{x2}$, and $a_y$, satisfy following formulae and inequality:

$$a_{x1} = \frac{1}{\sqrt{3}\,r} a_y,$$

$$a_{x2} = \frac{r}{\sqrt{3}} a_y, r > 1.$$

12. The photonic crystal surface emission laser according to claim 2, wherein:
the length of the one of the two diagonals having different lengths in the first rhombic-like lattice and/or the second rhombic-like lattice differs according to a position in a direction in which the diagonals having different lengths extend, and the photonic crystal surface emission laser comprises:
an electric current injection unit capable of injecting an electric current into only a portion of the active layer and changing an injection position of the electric current in the direction of the diagonals.

13. The photonic crystal surface emission laser according to claim 12, the first rhombic-like lattice and/or the second rhombic-like lattice have a plurality of modified period areas in which the length of one of the two diagonals having different lengths differs in every modified period area.

14. The photonic crystal surface emission laser according to claim 12, wherein the length of the one of the two diagonals having different lengths in the first rhombic-like lattice or the second rhombic-like lattice changes continuously.

15. The photonic crystal surface emission laser according to claim 2, comprising:
a plurality of modified period areas in which the length of one of the two diagonals having different lengths and the length of the other one of the two diagonals in the first rhombic-like lattice and/or the second rhombic-like lattice differ according to a position in a direction in which the one of the two diagonals and in a direction in which the other one of the two diagonals extend; and
an electric current injector capable of injecting an electric current into only a part of the active layer and changing an injection position of the electric current in the direction of the diagonals.

16. The photonic crystal surface emission laser according to claim 15 which satisfies following formulae and inequality:

$$a_{x1s} = \frac{1}{\sqrt{3}\,r_s} a_{ys}, a_{x2s} = \frac{r_s}{\sqrt{3}} a_{ys}, r_s > 1,$$

$$a_{ys} = \frac{\lambda}{n} \sqrt{\frac{1}{1-\left(\frac{\sin\theta_s}{n}\right)^2}}, \text{ and}$$

$$r = \frac{2}{\sqrt{3}} \sqrt{\frac{\sin^2\theta_s}{n^2 - \sin^2\theta_s}} + \sqrt{\frac{4}{3}\frac{\sin^2\theta_s}{n^2 - \sin^2\theta_s} + 1},$$

where $a_{x1s}$ and $a_{ys}$ respectively represent the length of one of the two diagonals having different lengths and the length of the other one of the two diagonals of the first rhombic-like lattice, $a_{x2s}(a_{x2s} \neq a_{x1s})$ and $a_{ys}$ respectively represent the length of one of the two diagonals having different lengths and the length of the other one of the two diagonals of the second rhombic-like lattice, and $\theta_s$ and $\lambda$ respectively represent an emission angle and a wavelength of a beam emitted outside.

\* \* \* \* \*